United States Patent
Park et al.

(10) Patent No.: US 10,912,197 B2
(45) Date of Patent: Feb. 2, 2021

(54) DISPLAY DEVICE

(71) Applicant: Samsung Display Co., Ltd., Yongin-si (KR)

(72) Inventors: Jae Chun Park, Seoul (KR); Chang Min Park, Gwangmyeong-si (KR); Sang Wol Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/388,577

(22) Filed: Apr. 18, 2019

(65) Prior Publication Data

US 2019/0350081 A1 Nov. 14, 2019

(30) Foreign Application Priority Data

May 11, 2018 (KR) .................. 10-2018-0054097

(51) Int. Cl.
| | |
|---|---|
| *H05K 7/00* | (2006.01) |
| *H05K 1/14* | (2006.01) |
| *H05K 1/18* | (2006.01) |
| *H05K 1/02* | (2006.01) |
| *H01L 27/32* | (2006.01) |
| *H01L 51/00* | (2006.01) |
| *H01L 51/52* | (2006.01) |

(52) U.S. Cl.
CPC ......... *H05K 1/147* (2013.01); *H01L 27/3276* (2013.01); *H05K 1/0204* (2013.01); *H05K 1/028* (2013.01); *H05K 1/144* (2013.01); *H05K 1/181* (2013.01); *H01L 51/0097* (2013.01); *H01L 51/5253* (2013.01); *H01L 2251/5338* (2013.01); *H05K 2201/041* (2013.01); *H05K 2201/056* (2013.01); *H05K 2201/10128* (2013.01)

(58) Field of Classification Search
USPC ......................................................... 361/760
See application file for complete search history.

(56) References Cited

U.S. PATENT DOCUMENTS

| | | | | |
|---|---|---|---|---|
| 2003/0086049 A1* | 5/2003 | Yamazaki | ........... | G02F 1/13452 349/149 |
| 2008/0012474 A1* | 1/2008 | Sung | .................. | H01L 27/3276 313/504 |
| 2018/0011576 A1 | 1/2018 | Ryu | | |

FOREIGN PATENT DOCUMENTS

| | | |
|---|---|---|
| KR | 10-2017-0057073 A | 5/2017 |
| KR | 10-2017-0132382 A | 12/2017 |

* cited by examiner

*Primary Examiner* — Andargie M Aychillhum
(74) *Attorney, Agent, or Firm* — Lewis Roca Rothgerber Christie LLP

(57) ABSTRACT

A display device includes a display panel, a connection film connected to one side of the display panel, a circuit board connected to the connection film, and a coupling portion coupling the connection film and the circuit board, located at an area where the connection film and the circuit board overlap each other, and including a conductive first coupling portion for coupling the connection film and the circuit board, and an insulative second coupling portion for coupling the connection film and the circuit board.

20 Claims, 18 Drawing Sheets

DISPLAY DEVICE

CROSS-REFERENCE TO RELATED APPLICATION

This application claims priority to, and the benefit of, Korean Patent Application No. 10-2018-0054097 filed on May 11, 2018 in the Korean Intellectual Property Office, the disclosure of which is incorporated herein by reference in its entirety.

BACKGROUND

1. Field

Embodiments of the present invention relate to a display device including a connection film and a circuit board.

2. Description of the Related Art

A display device, which is a device for displaying an image, includes a display panel, such as an organic light emitting display panel or a liquid crystal display panel. Further, the display device includes a circuit board mounted with electronic components suitable for driving a display panel, and a connection film for connecting the circuit board to the display panel.

Meanwhile, a mobile electronic appliance includes a display device for providing an image to a user. The proportion of mobile electronic appliances having a larger display screen, while also having a volume or thickness equal to or smaller than that in the related art, has increased. To provide a larger screen only at the time of use, a foldable display device or a bendable display device having a structure capable of folding or unfolding has been developed.

SUMMARY

An aspect of embodiments of the present invention provides a display device having a layout configuration with relatively high internal space utilization.

An embodiment of the invention provides a display device including a display panel, a connection film connected to one side of the display panel, a circuit board connected to the connection film, and a coupling portion coupling the connection film and the circuit board, located at an area where the connection film and the circuit board overlap each other, and including a conductive first coupling portion for coupling the connection film and the circuit board, and an insulative second coupling portion for coupling the connection film and the circuit board.

The connection film may include a first wiring connected to the first coupling portion, wherein the circuit board includes a second wiring connected to the first coupling portion, and wherein the second coupling portion overlaps the first wiring and the second wiring.

The first coupling portion may adjacent to one side of the connection film in a first direction, and is adjacent to one side of the circuit board in the first direction, wherein the second coupling portion is adjacent to the other side of the circuit board.

The display device may further include an integrated circuit adjacent the connection film and connected to the first wiring, wherein the circuit board does not overlap the integrated circuit.

The circuit board may include a circuit area not overlapping the connection film and extending in a second direction crossing the first direction, wherein a length of the second coupling portion in the second direction is longer than a length of the first coupling portion in the second direction, and wherein the second coupling portion extends further in the second direction in a plan view than the first coupling portion.

The circuit board may include a circuit area extending in a second direction crossing the first direction, wherein the second coupling portion includes a plurality of first coupling patterns extending in the first direction with a first width, and repeatedly arranged along the second direction, and wherein a distance between adjacent ones of the first coupling patterns decreases toward the circuit area of the circuit board.

The second coupling portion may include a plurality of second coupling patterns extending in a second direction crossing the first direction with a first width, and repeatedly arranged along the first direction, wherein a distance between adjacent ones of the second coupling patterns decreases toward the first coupling portion.

The second coupling portion may include a plurality of coupling patterns extending in a third direction with a first width, and repeatedly arranged along a fourth direction crossing the third direction, wherein the third direction is a direction in which a reference line connecting two points that are spaced farthest from each other in an overlapping area where the connection film and the circuit board overlap each other is extended.

The circuit board may include a circuit area extending in a second direction crossing a first direction, wherein one end of the reference line is adjacent to the circuit area and the first coupling portion.

The second coupling portion may be a pressure-sensitive adhesive film having a thickness that is equal to a thickness of the first coupling portion, wherein a distance between the connection film and the circuit board is uniform throughout an overlapping area, and wherein the overlapping area is an area where the connection film and the circuit board overlap each other.

The display panel may include a first area and a second area, wherein a degree of bending of the first area due to an external force is lower than a degree of bending of the second area due to the external force, and wherein the connection film and the circuit board overlap the first area in a thickness direction, and do not overlap the second area.

The one side of the display panel may be bent in the thickness direction of the display panel, wherein the connection film is connected to a first surface of the display panel through a first contact portion formed on a first surface of the connection film, and wherein the first coupling portion is directly connected to a second contact portion formed on a second surface of the connection film and a third contact portion formed on a first surface of the circuit board.

The one side of the connection film may be bent in a thickness direction of the display panel, wherein the connection film is connected to a first surface of the display panel through a first contact portion formed on a first surface of the connection film, and wherein the first coupling portion is directly connected to a second contact portion formed on a second surface of the connection film and a third contact portion formed on a first surface of the circuit board.

Another embodiment of the invention provides a display device including a display panel, a connection film connected to one side of the display panel, a circuit board connected to the connection film, the circuit board overlapping the connection film, a conductive first coupling portion between the connection film and the circuit board for coupling the connection film and the circuit board, and an insulative coupling film coupling the connection film and the circuit board, wherein the circuit board is located between the connection film and the coupling film.

The display device may further include an integrated circuit adjacent the coupling film and connected to first wiring in the connection film, wherein the coupling film overlaps the integrated circuit, wherein the coupling film includes a first insulating layer directly contacting the integrated circuit, a first conductive layer overlapping the first insulating layer in a thickness direction, and a second conductive layer overlapping the first conductive layer in the thickness direction, and wherein the first conductive layer is connected to a ground electrode formed on the circuit board.

A space formed along a side surface of the integrated circuit and communicating with the outside may be located between the coupling film and the connection film.

The coupling film may further include a heat radiation layer overlapping the second conductive layer, and completely overlapping the integrated circuit in the thickness direction.

The one side of the display panel may be bent in a thickness direction of the display panel, wherein the connection film is connected to a first surface of the display panel through a first contact portion formed on a first surface of the connection film, wherein the first coupling portion is directly connected to a second contact portion formed on a second surface of the connection film, and to a third contact portion formed on a first surface of the circuit board, and wherein the connection film completely overlaps the coupling film in the thickness direction.

The connection film may partially overlap the one side of the display panel and may be attached to the one side of the display panel.

The display device may further include an insulative second coupling portion in an area where the connection film and the circuit board overlap each other for coupling the connection film and the circuit board.

Therefore, the display device according to the described embodiments may have a relatively high internal space utilization by overlapping the circuit board with the coupling film. In addition, the display device may prevent a damage at the contact portion between the coupling film and the circuit board, and may have improved product reliability by fixing the circuit board to the coupling film using a coupling layer between the circuit board and the coupling film, or a bonding film covering the circuit board to the coupling film.

However, aspects of embodiments of the present invention are not restricted to the one set forth herein. The above and other aspects will become more apparent to one of ordinary skill in the art to which the present invention pertains by referencing the detailed description given below.

BRIEF DESCRIPTION OF THE DRAWINGS

The above and other aspects of embodiments of the present invention will become more apparent by describing in detail embodiments thereof with reference to the attached drawings, in which.

DETAILED DESCRIPTION

Figure 1:
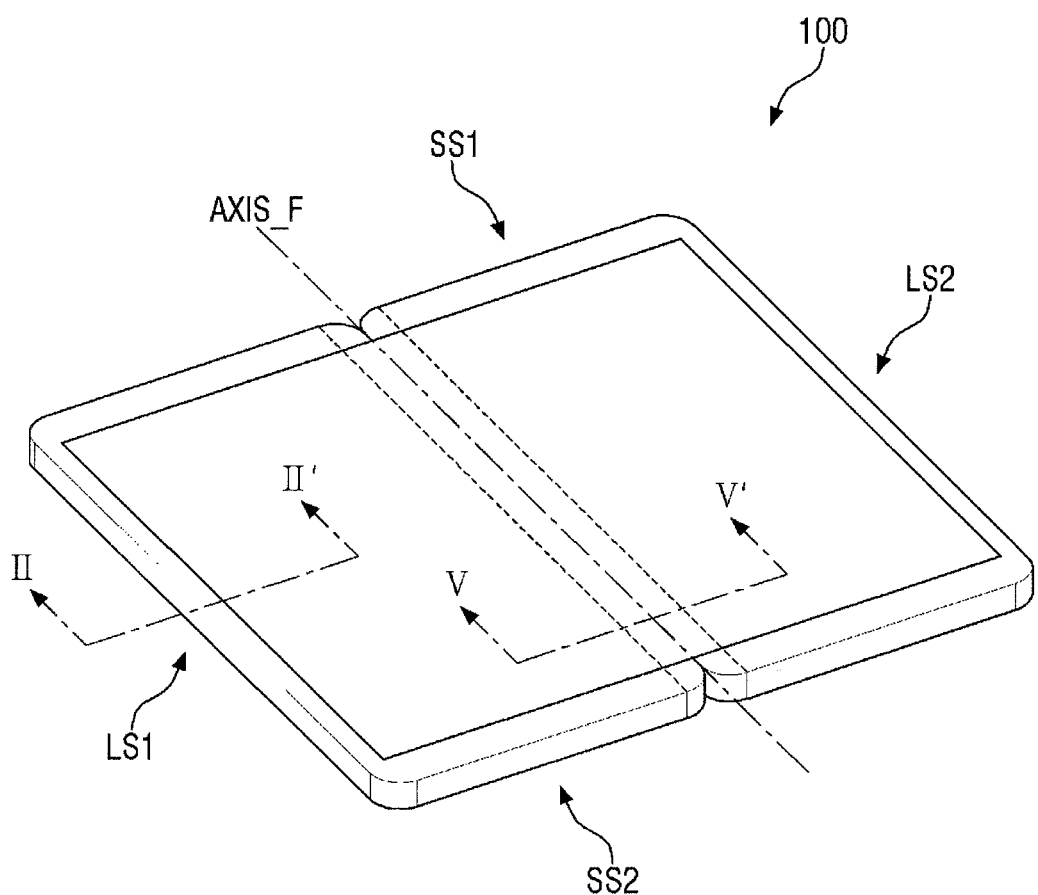
FIG. 1 is a perspective view of a display device according to an embodiment.

Features of the inventive concept and methods of accomplishing the same may be understood more readily by reference to the following detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present invention.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

In the following examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
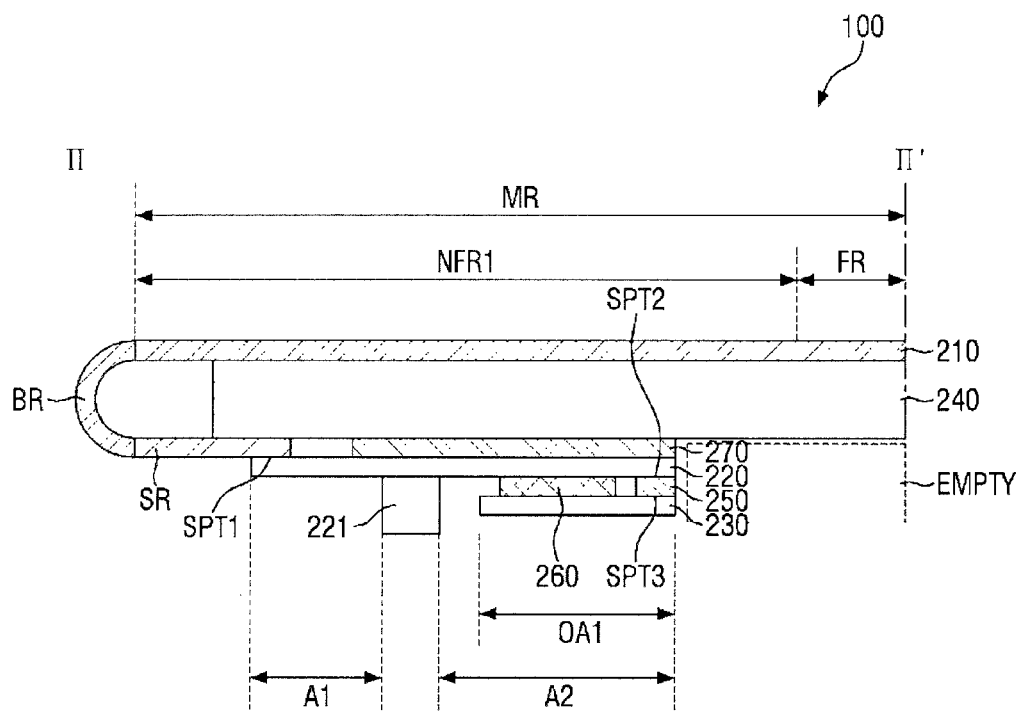
FIG. 2 is a cross-sectional view taken along the line II-II' in FIG. 1.
Figure 3:
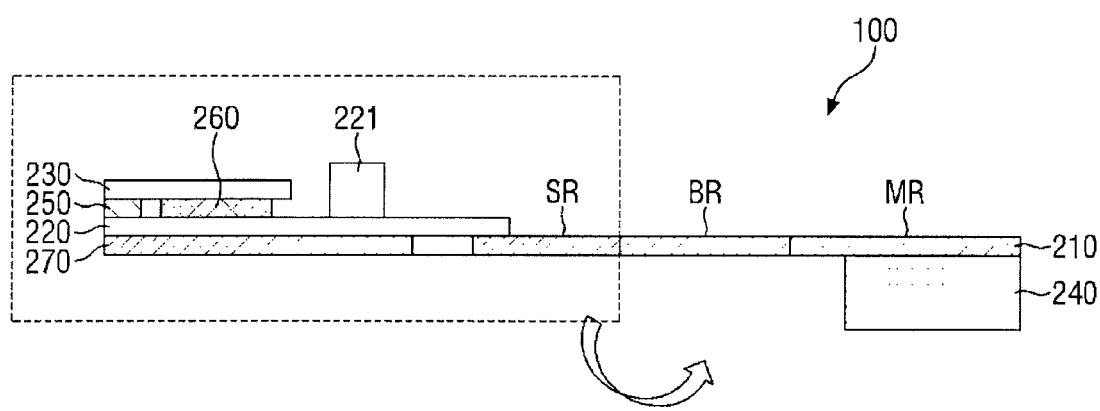
FIG. 3 is a cross-sectional view of a display device before bending.
Figure 4:
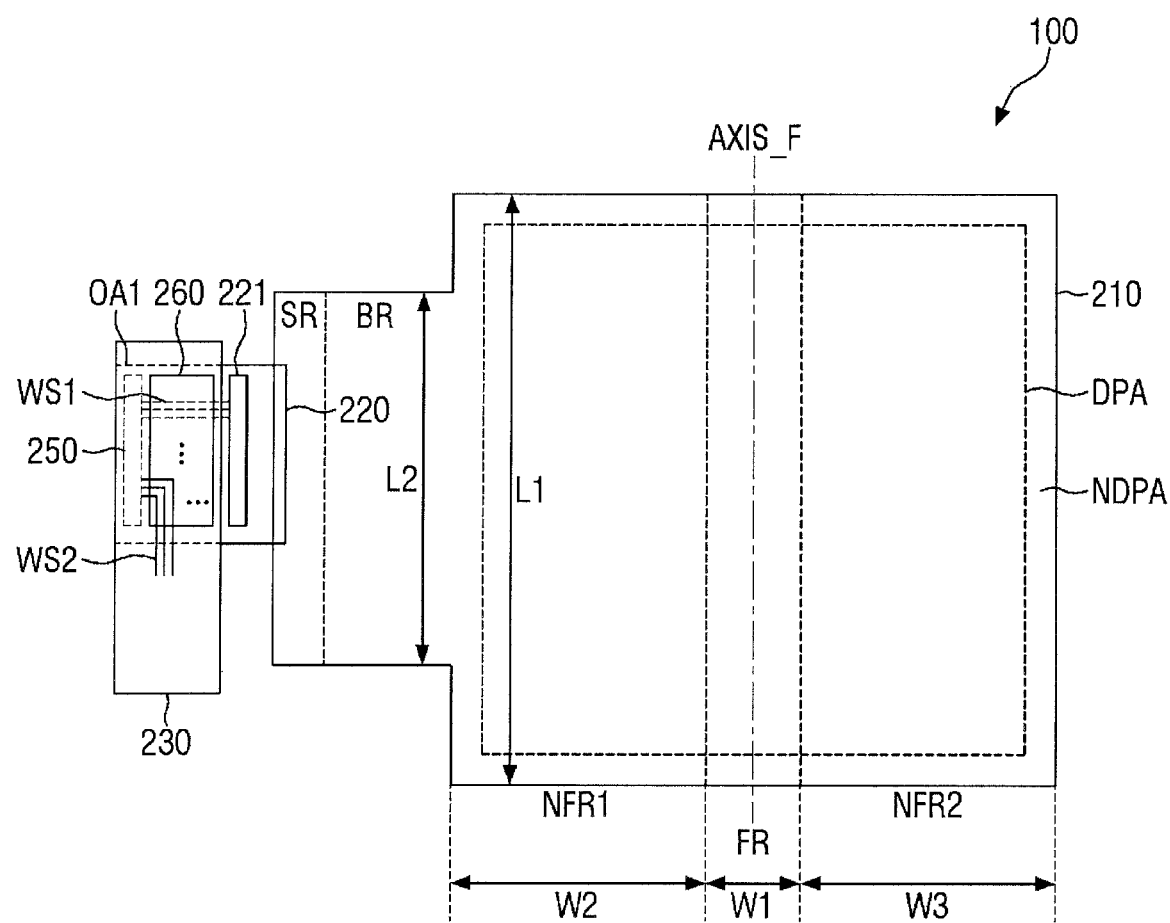
FIG. 4 is a plan view of the display device of FIG. 3.
Figure 5:
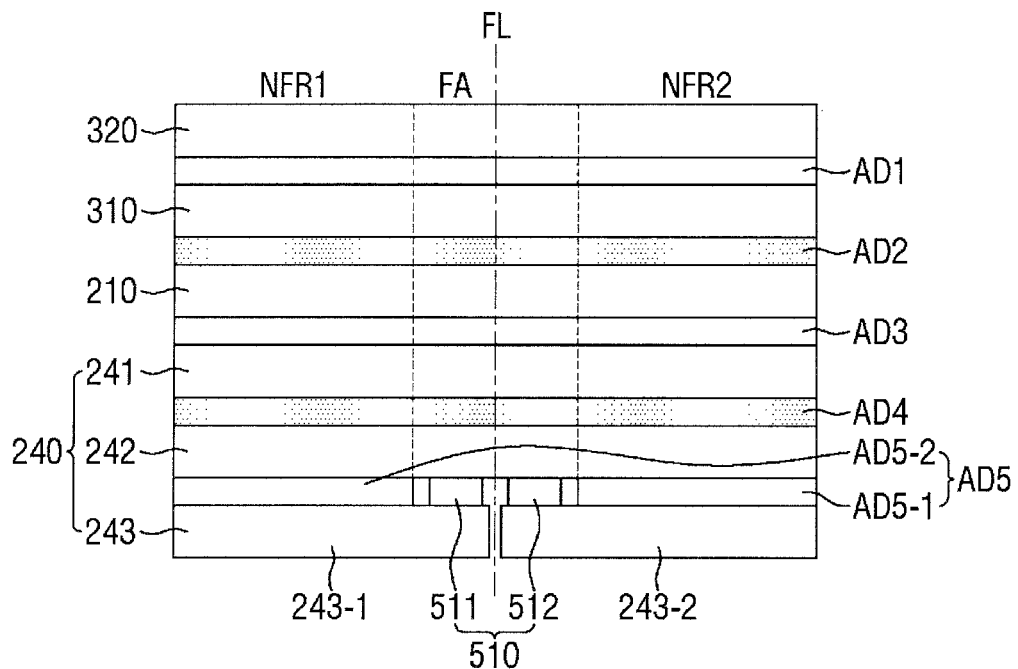
FIG. 5 is a cross-sectional view taken along the line V-V' in FIG. 1.
Figure 6:
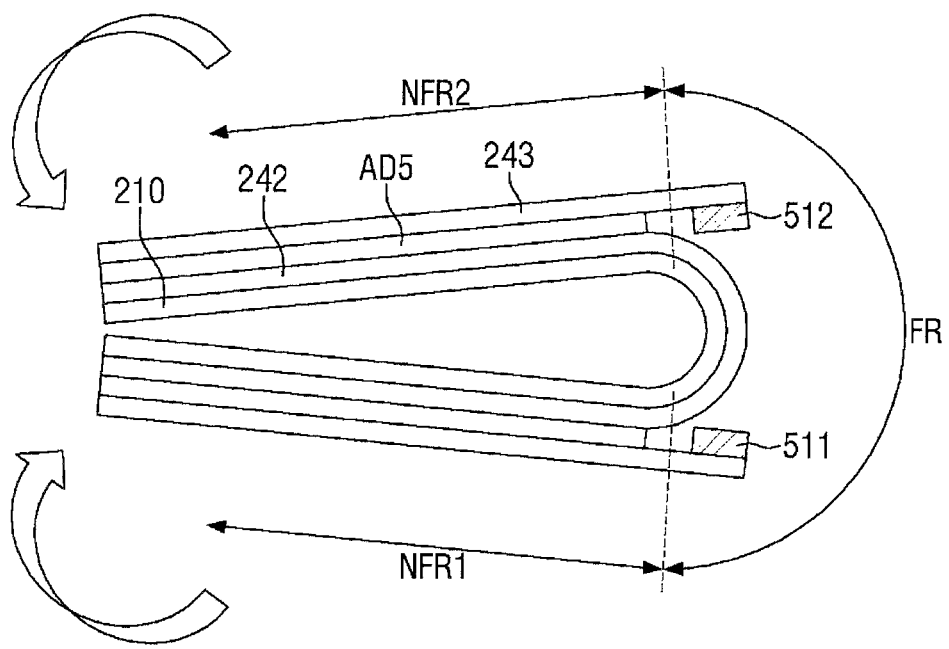
FIG. 6 is a cross-sectional view of the folded display device.

FIG. 1 is a perspective view of a display device according to an embodiment. FIG. 2 is a cross-sectional view taken along the line II-II' in FIG. 1. FIG. 3 is a cross-sectional view of a display device before bending. FIG. 4 is a plan view of the display device of FIG. 3. FIG. 5 is a cross-sectional view taken along the line V-V' in FIG. 1. FIG. 6 is a cross-sectional view of the folded display device.

Referring to FIGS. 1 to 6, a display device 100 may have a substantially rectangular shape in a plan view. The display device 100 may have a rectangular shape having angled corners in a plan view, or a rectangular shape having rounded corners in a plan view. The display device 100 may include four sides or edges. The display device 100 may include long sides LS1 and LS2 and short sides SS1 and SS2.

Unless defined otherwise, in this specification, the term "on", "over", "upper side", or "upper surface" in the thickness direction refers to a side of a display surface with respect to a display panel, and the term "beneath", "under", "lower side", or "lower surface" refers to a side opposite to a display surface with respect to the display panel. Further, the term "upper (over)", "lower (under)", "left", or "right" in the plane direction refers to a direction when viewed from above with a display surface placed at a fixed position.

In a plan view of the display device 100, the long side located at the left side thereof is referred to as a first long side LS1, the long side located at the right side thereof is referred to as a second long side LS2, the short side located at the upper side thereof is referred to as a first short side SS1, and the short side located at the lower side thereof is referred to as a second short side SS2. The lengths of the long sides LS1 and LS2 of the display device 100 may be in a range of about 1.2 to about 2.5 times that of the lengths of the short sides SS1 and SS2 thereof, respectively, but the present invention is not limited thereto.

The display device 100 may be capable of switching between a folded state and an unfolded state based on a folding axis AXIS_F crossing the first short side SS1 and the second short side SS2. A concave portion (for example, a notch, which may be indented toward the center of gravity on the plane) is formed at each of the first short side SS1 and the second short side SS2 of the display device 100 corresponding to the folding axis AXIS_F, and a hinge member may be coupled to the concave portion, but the present invention is not limited thereto. Meanwhile, the switching of the display device 100 between a folded state and an unfolded state will be described later with reference to FIGS. 5 and 6.

The display device 100 may include a display panel 210, a connection film 220, a circuit board 230, a first coupling layer 250 (or a first coupling portion, which may be a conductive first coupling portion), and a second coupling layer 260 (or a second coupling portion, which may be an insulative second coupling portion). The first and second coupling layers 250 and 260 may be referred to as one coupling portion. The display device 100 may further include a cover panel 240, an optical film 310, and a window 320.

The display panel 210 may display an image by the input data signal. The display panel 210 may be an organic light emitting display panel, a liquid crystal display panel, a plasma display panel, an electrophoretic display panel, an electrowetting display panel, a quantum dot emission display panel, or a micro light emitting diode (LED) display panel. In an embodiment, an organic light emitting display panel is used as the display panel 210.

The display panel 210 may include a flexible substrate including a flexible polymer material such as polyimide. Thus, the display panel 210 may be warped, bent, curved, folded, or rolled.

The display panel 210 may include a main region MR, a bending region BR, and a sub region SR. The bending region BR and the sub region SR may be distinguished from the main region MR based on the direction in which one side of the display panel 210 faces the other side of the display panel 210 connected to the circuit board 230.

The main region MR may have a shape substantially similar to the planar shape of the display device 100. The main region MR may be a flat region located on one plane. However, the main region MR is not limited thereto. In the main region MR, at least one of edges other than the edges (sides) connected to the bending region may be bent to form a curved surface, or may be bent in a vertical direction.

If an area corresponding to a screen in the display panel is defined as a display area DPA, and an area not displaying a screen in the display panel 210 is defined as a non-display area NDA, the display area DPA of the display panel 210 is located in the main region MR.

The residual area other than the display area DPA may be the non-display area NDA of the display panel 210. In an embodiment, the non-display area NDA may include a peripheral edge portion of the display area DPA in the main region MR, the entire bending region BR, and the entire sub region SR. However, the display area DPA and the non-display area NDA are not limited thereto, and the bending region BR and/or the sub region SR may also include the display area DPA.

The display area DPA of the display panel 210 may be located at the center of the main region MR. The display area DPA may include a pixel. The pixel may include a light emitting layer and a circuit layer for controlling the amount of light emitted from the light emitting layer. The circuit layer may include a display wiring, a display electrode, and at least one transistor. The light emitting layer may include an organic light emitting material. The light emitting layer may be encapsulated by an encapsulation film. The encapsulation film encapsulates the light emitting layer to prevent external moisture or the like from unwanted permeation or inflowing. The encapsulation layer may be an inorganic single-layered film, an inorganic multi-layered film, or a laminate film in which organic films and inorganic films are alternately laminated.

The display area DPA may have a rectangular shape or may have a rectangular shape having rounded corners. However, the present invention is not limited thereto, and the display area DPA may have a square shape or may have various shapes, such as a polygonal shape, a circular shape, and an elliptical shape.

In the main region MR, when at least one of edges or sides that are other than the edges/sides connected to the bending region forms a curved surface or is bent, the display area DPA may or may not be located at the corresponding at least one edge.

In the main region MR, the non-display area NDA may be located around the display area DPA. The non-display area NDA of the main region MR may be an area from the outer boundary of the display area DPA to the edge of the display panel 210. The non-display area DPA of the main region MR may include therein signal lines and driving circuits for applying signals to the display area DPA. Further, the non-display area DPA of the main region MR may be provided with an outermost black matrix.

Meanwhile, when the display device 100 is a foldable display device, the main region MR may include a foldable region FR. The foldable region FR will be described later together with the cover panel 240.

The bending region BR is connected to one side of the main region MR. For example, the bending region BR may be connected through, or may extend through, the first long side LS1 of the main region MR. The second length L2 (or vertical length) of the bending region BR may be shorter than the first length L1 of the main region MR, as shown in FIG. 4, but the present invention is not limited thereto.

In the bending region BR, the display panel 210 is bent with a curvature in a downward direction (that is, a direction away from, or facing the opposite side of, the display surface of the display panel 210). Although the bending region BR may have a constant curvature radius throughout the bending region BR, the present invention is not limited thereto, and the bending region BR may have different curvature radiuses for each section. As the display panel 210 is bent in the bending region BR, the surface of the display panel 210 is inverted. That is, one side of the display panel 210 faces upward in the main region MR, faces toward a lateral side (for example, a left side) in the bending region BR, and also faces downward in the sub region SR.

The sub region SR extends from the bending region BR. The sub region SR may extend in a direction parallel to the main region MR with respect to a portion where bending of the display panel 210 is completed (e.g., a portion that is outside of the bending region). The sub region SR may overlap the main region MR in the thickness direction of the display panel 210. The sub region SR overlaps the non-display area NDA of the edge of the main region MR, and may also overlap the display area DPA of the main region MR.

A wiring may be located between the bending region BR and the sub region SR. The wiring of the bending region BR may be connected to the circuit layer of the main region MR, and may extend to the sub region SR. The wiring extending to the sub region SR may be connected to the circuit board 230 through the connection film 220.

The connection film 220 may be located to overlap the display panel 210 in the thickness direction of the display panel 210. The connection film 220 may be fixed to the bottom of the display panel 210 (or the cover panel 240) through an adhesive layer 270. The adhesive layer 270 will be described later.

Hereinafter, an arrangement relationship (for example, "top", "bottom", "left", and "right") of the connection film 220, the circuit board 230, the first coupling layer 250, the second coupling layer 260, and the adhesive layer 270 will be described with reference to FIG. 2.

One end of the connection film 220 may be attached to the wiring of the sub region SR of the display panel 210, and the other end of the connection film 220 may be attached to the circuit board 230. For example, the left upper surface of the connection film 220 (e.g., a portion near where the display surface of the display panel 210 is inverted by bending) may attached to the lower surface of the sub region SR through a first contact portion SPT1, and the right lower surface of the connection film 220 may be attached to the right upper surface of the circuit board 230.

In another embodiment, the lower left surface of the connection film 220 may be attached to the upper surface of the sub region SR of the display panel 210 (e.g., such that the connection film 220 is between the cover panel 240 and the display panel 210). The first contact portion SPT1 may be located on the upper surface or lower surface of the connection film 220 in consideration of the bending curvature of the bending region BR of the display panel 210 and the total thickness of the display device 100.

The connection film 220 may be attached to the circuit board 230 at a second contact portion SPT2 through the first coupling layer 250. For example, the first coupling layer 250 may be an anisotropic conductive film (ACF). The first coupling layer 250 may electrically connect a first wiring formed at (or connected to) the second contact portion SPT2 of the connection film 220 to a second wiring formed at (or connected to) a third contact portion SPT3 of the circuit board 230. Similarly, the connection film 220 may be attached to the display panel 210 at the first contact portion SPT1 through an anisotropic conductive film (ACF).

Meanwhile, although it is shown in FIG. 2 that the display device 100 includes the first coupling layer 250, and that the first coupling layer 250 has a given thickness, this is for the purpose of illustrating that the first coupling layer 250 is different from the second coupling layer 260 to be described later, and the present invention is not limited thereto. For example, the connection film 220 may be attached directly to the circuit board 230 by an ultrasonic bonding technique, and the first coupling layer 250 may be a portion where the connection film 220 and the circuit board 230 are melted and bonded.

The connection film 220 may be a chip-on film. As shown in FIG. 2, a driving chip 221 (or an integrated circuit) may be mounted on the lower surface of the chip-on film/connection film 220. In another embodiment, the driving chip 221 may also be mounted on the upper surface of the chip-on film/connection film 220.

The connection film 220 may include a first area A1 and a second area A2 that are located at left and right sides with respect to the driving chip 221. The first area A1 may be an area from the first contact portion SPT1 to the driving chip 221, and the second area A2 may be an area from the driving chip 221 to the second contact portion SPT2. The width of the first area A1 (e.g., from left to right) may be smaller than or equal to the width of the second area A2. For example, the ratio of the width of the second area A2 to width of the first area A1 may be about two or more. When the driving chip 221 is relatively close to the first contact portion SPT1 (or relatively close to the sub region SR of the display panel 210), the second area A2 may have an area sufficient for the circuit board 230 to be overlapped.

The circuit board 230 may be a flexible printed circuit board. The circuit board 230 may be provided in the form of film-on-plastic, but the present invention is not limited thereto.

The circuit board 230 may be located under the connection film 220 at the second area A2, and may overlap the second area A2 of the connection film 220 in the thickness direction. The width of the circuit board 230 may be smaller than the width of the second area A2 of the connection film 220. The right side of the circuit board 230 may be aligned with, or located on the same plane (for example, a plane perpendicular to the upper surface of the circuit board 230) as, the right side of the connection film 220. One of the right side of the connection film 220 and the right side of the circuit board 230 may protrude from, or extend beyond, the other, although the area, or length in the horizontal direction, of the protruding portion may be much smaller than the area/length of an overlapping area OA1 where the circuit board 230 and the connection film 220 overlap each other. For example, the ratio between the area of the protruding portion and the area of the overlapping area OA1 may be about 1/10 or less.

The second coupling layer 260 may be located between the connection film 220 and the circuit board 230, and the second coupling layer 260 may fix the circuit board 230 to the connection film 220. The second coupling layer 260 fixes at least a part of a side of the circuit board 230 opposite the side of the circuit board 230 fixed to the connection film 220 through the first coupling layer 250, to thereby prevent the circuit board 230 from being spaced apart from the connection film 220 or from being partially bent, and to thereby avoid the damage of the first coupling layer 250 (for example, pad/wiring crack at the second contact portion SPT2 or the third contact portion SPT3) due to spacing or bending of the circuit board 230.

As shown in FIG. 4, the second coupling layer 260 may be located on most of the overlapping area OA1 of the connection film 220 and the circuit board 230. For example, the second coupling layer 260 may have an area of about 60% to about 75% or more of the remaining area of the overlapping area OA1 not including the first coupling layer 250. In this case, the first wirings WS1 formed on the connection film 220 and connected to the second contact portions SPT2 may overlap the second coupling layer 260 in the thickness direction. Similarly, the second wirings WS2 formed on the circuit board 230 and connected to the third contact portion SPT3 may overlap the second coupling layer 260 in the thickness direction. The second coupling layer 260 may reduce the signal interference between the connection film 220 (or the first wirings WS1) and the circuit board 230 (or the second wirings WS2) overlapping each other.

The length of the second coupling layer 260 in the vertical direction may be the same as, or different from, the length of the first coupling layer 250 in the vertical direction.

For example, the length of the second coupling layer 260 in the vertical direction may be equal to the length of the first coupling layer 250 in the vertical direction, and the upper side (or lower side) of the second coupling layer 260 may be located at the same plane (or at the same line) as the upper side (or lower side) of the first coupling layer 250. In this case, stress due to the non-overlapping portion of the circuit board 230 (for example, a portion extending downward from the overlapping area OA1 with the connection film 220) may be uniformly distributed to the first coupling layer 250 and the second coupling layer 260.

As another example, the length of the second coupling layer 260 in the vertical direction may be longer than the length of the first coupling layer 250 in the vertical direction, and the upper side of the second coupling layer 260 may be located on the same plane (or the same line) as the upper side of the first coupling layer 250. As still another example, the length of the second coupling layer 260 in the vertical direction may be shorter than the length of the first coupling layer 250 in the vertical direction. The second coupling layer 260 may be formed longer than the first coupling layer 250 in consideration of the relationship between the coupling force of the first coupling layer 250 and the coupling force of the second coupling layer 260 and the width of the second coupling layer 260 in the horizontal direction.

In an embodiment, the second coupling layer 260 may be a pressure-sensitive adhesive (PSA) film. Referring to FIG. 2, the second coupling layer 260 has the same thickness as the first coupling layer 250, and may uniformly maintain the gap between the connection film 220 and the circuit board 230 over the entire overlapping area OA1.

As shown in FIG. 3, after the display panel 210 is connected to the connection film 220, and the circuit board 230 is attached to the connection film 220, a process of bending the bending region BR of the display panel 210, and a coupling process of fixing the sub region SR of the bent display panel 210 (and the connection film 220) to the bottom of the display panel 210, may be performed. In the bending process and the coupling process, pressure may be applied to the circuit board 230 in the bending direction of the display panel 210. In this case, the pressure-sensitive adhesive film can prevent or reduce warping or deformation of the circuit board 230 with respect to the connection film 220 due to pressurization, and can prevent or reduce damage of the first coupling layer 250 due to the pressurization.

The adhesive layer 270 may be located between the connection film 220 and the display panel 210 (or the cover panel 240) to fix the connection film 220 to the display panel 210. For example, the adhesive layer 270 may be a pressure-sensitive adhesive film.

The adhesive layer 270 may overlap the driving chip 221 on the connection film 220 in the thickness direction, or might not overlap the driving chip 221. When the adhesive layer 270 overlaps the driving chip 221, according to the characteristics of the adhesive layer 270, it is possible to transfer the heat generated from the driving chip 221 to a heat radiation layer provided in the cover panel 240, or to reduce or prevent heat generated from the driving chip 221 from moving to the display panel 210. When the adhesive layer 270 does not overlap the driving chip 221, the heat generated from the driving chip 221 may be discharged to the outside through a space between the connection film 220 and the cover panel 240 (or through a space between the sub region SR of the display panel 210 and the adhesive layer 270).

Meanwhile, the cover panel 240 (or a cover panel member or a cover module) is located under the main region MR of the display panel 210. The cover panel 240 includes at least one functional layer. The functional layer may be a layer that performs a heat radiation function, an electromagnetic wave blocking function, a grounding function, a buffering function, a strength enhancing function, a supporting function, a coupling function, a pressure sensing function, or a digitizing function. The functional layer may be a sheet layer, a film layer, a thin film, a coating layer, a panel, or a plate. One functional layer may be a single layer, but may be a laminate of a plurality of thin films or coating layers. Examples of the functional layer may include a supporting substrate, a heat radiation layer, an electromagnetic wave blocking layer, an impact absorbing layer, a coupling layer, a pressure sensor, and a digitizer.

As shown in FIG. 5, the cover panel 240 may include a second substrate 241, a fourth adhesive layer AD4, an impact absorbing layer 242, a fifth adhesive layer AD5, and a hard layer 243.

The second substrate 241 may be located under the display panel 210, and may be coupled to the display panel 210 through a third adhesive layer AD3. Each of the third adhesive layer AD3, the fourth adhesive layer AD4, and the fifth adhesive layer AD5 may include a pressure-sensitive adhesive. Each of the third adhesive layer AD3, the fourth adhesive layer AD4, and the fifth adhesive layer AD5 may be provided in the form of a single-sided tape or a double-sided tape.

The second substrate 241 may include polyethylene terephthalate (PET), polyimide (PI), polycarbonate (PC), polyethylene (PE), polypropylene (PP), polysulfone (PSF), polymethylmethacrylate (PMMA), triacetylcellulose (TAC), or cycloolefin. The second substrate 241 may be a patterned film.

The impact absorbing layer 242 may be located under the second substrate 241, and may be coupled to the second substrate 241 through the fourth adhesive layer AD4. The impact absorbing layer 242 can reduce or prevent an impact from the outside (for example, downward direction) from being transferred to the display panel 210. For example, the impact absorbing layer 242 may include polyurethane (PU), thermoplastic polyurethane (TPU), silicone (Si), or polydimethylacrylamide (PDMA).

The hard layer 243 may be located under the impact absorbing layer 242, and may be coupled to the impact absorbing layer 242 through the fifth adhesive layer AD5. The hard layer 243 may include a metal material such as stainless steel (SUS) or a polymer such as polymethyl methacrylate (PMMA), polycarbonate (PC), polyvinyl alcohol (PVA), acrylonitrile-butadiene-styrene (ABS) or terephthalate (PET). The hard layer 243 can alleviate the degree of bending of the display panel 210 by an external force, and can maintain the display panel 210 in a relatively flat state.

Meanwhile, when the display panel 210 is implemented as a flexible display panel, the hard layer 243 may include a first hard layer 243-1 and a second hard layer 243-2, which may be separated from each other (e.g., to be located at the left and right sides, respectively).

Although it is shown in FIG. 5 that the first hard layer 243-1 and the second hard layer 243-2 are spaced apart from, and are therefore separated from, each other, the present invention is not limited thereto. For example, the first hard layer 243-1 and the second hard layer 243-2 may be located to be in contact with each other.

The first hard layer 243-1 may be coupled to the impact absorbing layer 242 through a second adhesive film AD5-2, and the second hard layer 243-2 may be coupled to the impact absorbing layer 242 through a first adhesive film AD5-1. Here, the first adhesive film AD5-1 and the second adhesive film AD5-2 are included in the fifth adhesive layer AD5, and may be separated from each other at the right and left sides.

The foldable region FR and first and second non-foldable regions NFR1 and NFR2 of the display panel 210 (or the main region MR) may be defined or set by the first adhesive film AD5-1 and the second adhesive film AD5-2, respectively. The first and second non-foldable regions NFR1 and NFR2, which are coupled to the first hard layer 243-1 and the second hard layer 243-2 through the first adhesive film AD5-1 and the second adhesive film AD5-2, respectively, may have a low degree of bending due to an external force, and may have a generally flat state. The foldable region FR, which is a region not directly coupled (or not directly supported) with the first hard layer 243-1 and the second hard layer 243-2, may have high degree of bending due to an external force, and may be a region capable of switching between a folded state and an unfolded state. For example, with respect to the same external force, the degree of deformation (for example, a bent angle) of the foldable region FR may be three times or more the degree of deformation of the first and second non-foldable regions NFR1 and NFR2.

Referring to FIG. 4, the foldable region FR may have a rectangular shape. For example, the foldable region FR may have a first width W1 in a horizontal direction with respect to the vertically extending folding axis AXIS_F, and may extend vertically. Meanwhile, the first width W1 may be determined by the bending curvature of the display panel 210 and the spacing distance between the first and second adhesive films AD5-1 and AD5-2, and may be de minimis/substantially zero. The first non-foldable region NFR1 may have a second width W2, and may be connected to one side (for example, a left side with respect to the folding axis AXIS_F) of the foldable region FR. The second non-foldable region NFR2 may have a third width W3, and may be connected to the other side (for example, a right side with respect to the folding axis AXIS_F) of the foldable region FR. The second width W2 of the first non-foldable region NFR1 may be the same as, or different from, the third width W3 of the second non-foldable region NFR2.

Meanwhile, the connection film 220 and the circuit board 230 may overlap the first non-foldable region NFR1 in the thickness direction, and might not overlap the foldable region FR or the second non-foldable region NFR2.

Referring to FIG. 5 again, the cover panel 240 may further include a step compensating layer 510 located between the first adhesive film AD5-1 and the second adhesive film AD5-2 (and/or between the impact absorbing layer 242 and the hard layer 243 in the foldable region FR of the display panel 210). The step compensating layer 510 may have a thickness that is equal to the thickness of the fifth adhesive layer AD5, may be implemented as a single-sided adhesive film, and may be attached to the upper surface of the hard layer 243. In the lamination process of attaching the hard layer 243 to the impact absorbing layer 242, the step compensating layer 510 can prevent the foldable region FR of the display panel 210 from being deformed by the step due to the fifth adhesive layer AD5 (that is, by the distance between the impact absorbing layer 242 and the hard layer 243), and can prevent the deterioration of image quality due to the deformation of the display panel 210.

An optical film 310 may be located over the display panel 210. The optical film 310 may include a polarizing film, a microlens, a prism film, or the like. The optical film 310 may have substantially the same shape as the main region MR of the display panel 210. The optical film 310 may be omitted. A second adhesive layer AD2 made of a pressure-sensitive adhesive or the like may be located on the lower surface of the optical film 310, and may be attached to the upper surface of the display panel 210 through the second adhesive layer AD2.

A window 320 is located over the optical film 310. The window 320 serves to cover and protect the display panel 210. The window 320 may be made of a transparent material. For example, the window 320 may include glass or plastic. When the window 320 includes plastic, the window 320 may have flexible properties.

Examples of the plastic applicable to the window 320 may include, but are not limited to, polyimide, polyacrylate, polymethyl methacrylate (PMMA), polycarbonate (PC), polyethylene naphthalate (PEN), polyvinylidene chloride, polyvinylidene difluoride (PVDF), polystyrene, an ethylene-vinylalcohol copolymer, polyethersulphone (PES), polyetherimide (PEI), polyphenylene sulfide (PPS), polyallylate, tri-acetyl cellulose (TAC), and cellulose acetate propionate (CAP). The plastic window 320 may include one or more of the aforementioned materials.

When the display device 100 is implemented as a foldable display device, the window 320 may further include a coating layer on the upper surface thereof. In an embodiment, the coating layer may be a hard coating layer including an organic layer and/or organic-inorganic composite layer including an acrylate compound. The organic layer may include an acrylate compound. The organic-inorganic composite layer may be a layer in which an inorganic material, such as silicon oxide, zirconium oxide, aluminum oxide, tantalum oxide, niobium oxide, or glass beads, is dispersed in an organic material such as an acrylate compound.

A first adhesive layer AD1 may be located between the window 320 and the optical film 310, and the window 320 and the optical film 310 may be coupled to each other by the first adhesive layer AD1. The first adhesive layer AD1 may be formed of an optical transparent adhesive film, an optical transparent adhesive tape, an optical transparent resin, or the like.

As described above, the display device 100 may have a structure in which the circuit board 230 is laminated on the connection film 220 to secure an empty space (e.g., empty space "EMPTY" in FIG. 2) having a certain thickness under the main region MR of the display panel 210. For example, a battery device for storing a power suitable for driving the display device 100 may be located in the empty space EMPTY, and in particular, a thicker high-capacity battery device may be located in the empty space EMPTY.

Further, the circuit board 230 is laminated on the connection film 220, so that the display device 100 (or the display panel 210) can be realized as a foldable display device that can be folded at the short side. In the case of the foldable display device, the lower space of the display device 100 may be divided into two sub spaces by the folding axis AXIS_F, and a driving circuit and the like may be arranged in the limited one sub space.

Moreover, the circuit board 230 is fixed to the connection film 220 through the second coupling layer 260, so that the damage of the first coupling layer 250 between the circuit board 230 and the connection film 220 can be reduced or prevented.

Meanwhile, although it is shown in FIG. 4 that the second coupling layer 260 is located over the entire overlapping area OA1 where the connection film 220 and the circuit board 230 overlap each other, the location and disposition of the second coupling layer 260 is not limited thereto. The second coupling layer 260 may be located at at least a part of the edge of the overlapping area OA1 where the connection film 220 and the circuit board 230 overlap each other, or may be uniformly distributed over the entire overlapping area OA1.

Hereinafter, other embodiments will be described.

FIGS. 7 to 13 are plan views of display devices according to various embodiments.

Figure 7:
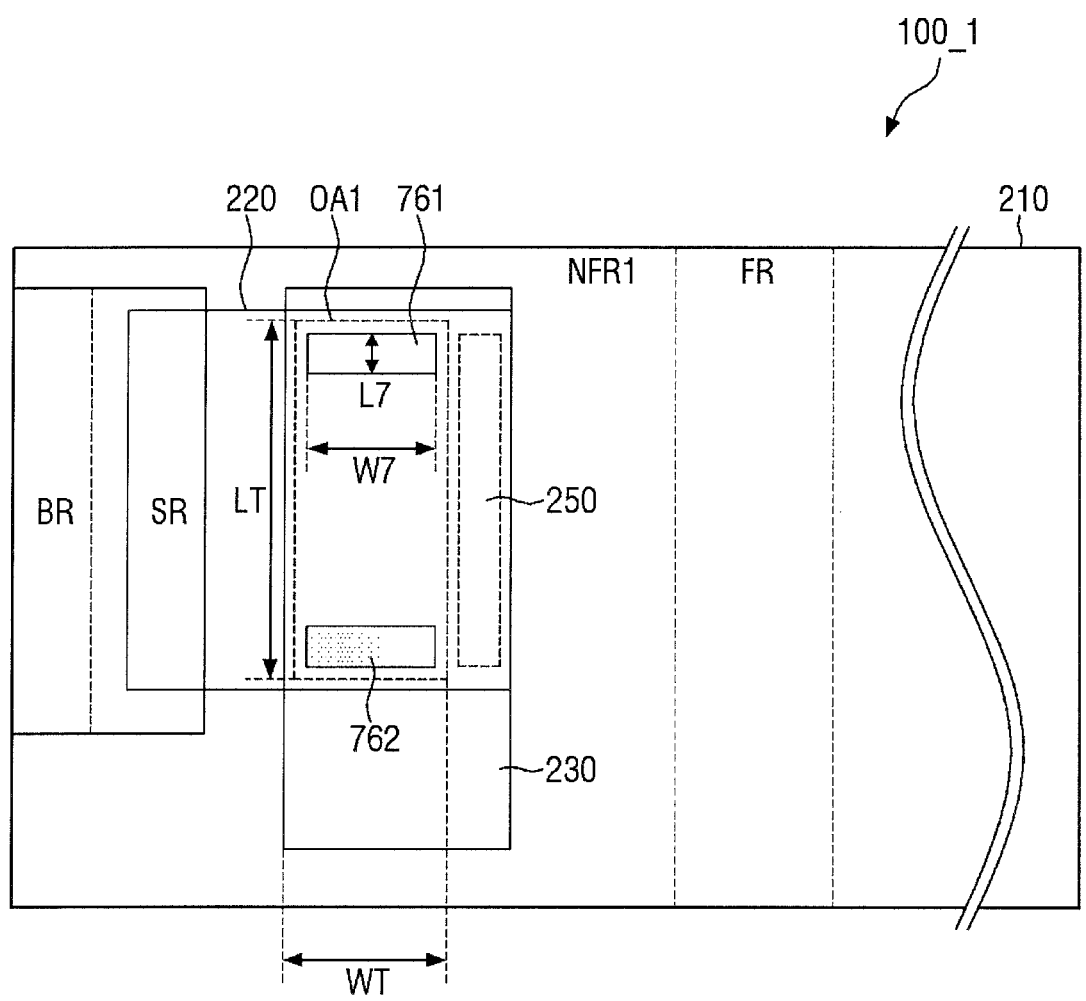
FIGS. 7 to 13 are plan views of display devices according to various embodiments.

First, referring to FIG. 7, a display device 100_1 (or a second coupling layer 260) of FIG. 7 is different from the display device 100 (or the second coupling layer 260) of FIG. 2, in that the display device 100_1 includes a first coupling member 761 and a second coupling member 762.

Each of the first coupling member 761 and the second coupling member 762 has a rectangular planar shape, but the present invention is not limited thereto. Each of the first coupling member 761 and the second coupling member 762 may have a seventh width W7 in the horizontal direction that is longer than a seventh length L7 in the vertical direction. For example, the ratio of the seventh width W7 to the seventh length L7 may be about 3 times or more. Because each of the first coupling member 761 and the second coupling member 762 are substantially the same as, or similar to, the second coupling layer 260 having been described with reference to FIG. 2, redundant description will not be repeated.

The first coupling member 761 and the second coupling member 762 may be located at the upper edge and lower edge of the overlapping area OA1, respectively, or may be located adjacent to the upper edge and lower edge thereof, respectively. Here, for convenience of explanation, the overlapping area OA1 may be an area corresponding to where the circuit board 230 and the connection film 220 overlap each other and not including the first coupling layer 250.

For example, the upper side of the first coupling member 761 may coincide with the upper side of the overlapping area OA1, and the lower side of the second coupling member 762 may coincide with the lower side of the overlapping area OA1. Meanwhile, the seventh width W7 of each of the first coupling member 761 and the second coupling member 762 may be equal to or smaller than the overlap width WT of the overlapping area OA1.

As another example, the upper side of the first coupling member 761 may be spaced apart from the upper side of the overlapping area OA1 by a suitable distance, and may be located on the same line (or the same plane) as the upper side of the first coupling layer 250. Similarly, the lower side of the second coupling member 762 may be spaced apart from the lower side of the overlapping area OA1 by a suitable distance, and may be located on the same line or plane as the lower side of the first coupling layer 250.

When the overlap width WT of the overlapping area OA1 is longer than the seventh length L7 (that is, the seventh length L7 of each of the first coupling member 761 and the second coupling member 762), and the overlap length LT of the overlapping area OA1 is shorter than the overlap width WT of the overlapping area OA1, the workability of the coupling process between the circuit board 230 and the connection film 220 can be improved through the first coupling member 761 and the second coupling member 762.

Meanwhile, although it is shown in FIG. 7 that the first coupling member 761 and the second coupling member 762 have the same seventh length L7 and the same seventh width W7, the present invention is not limited thereto. For example, considering a non-overlapping portion of the circuit board 130 (for example, a portion extending downward from the overlapping area OA1), the second coupling member 762 may have a length that is longer than the seventh length L7 of the first coupling member 761. As another example, the second coupling member 762 may have a width that is longer than the seventh width W7 of the first coupling member 761.

Figure 8:
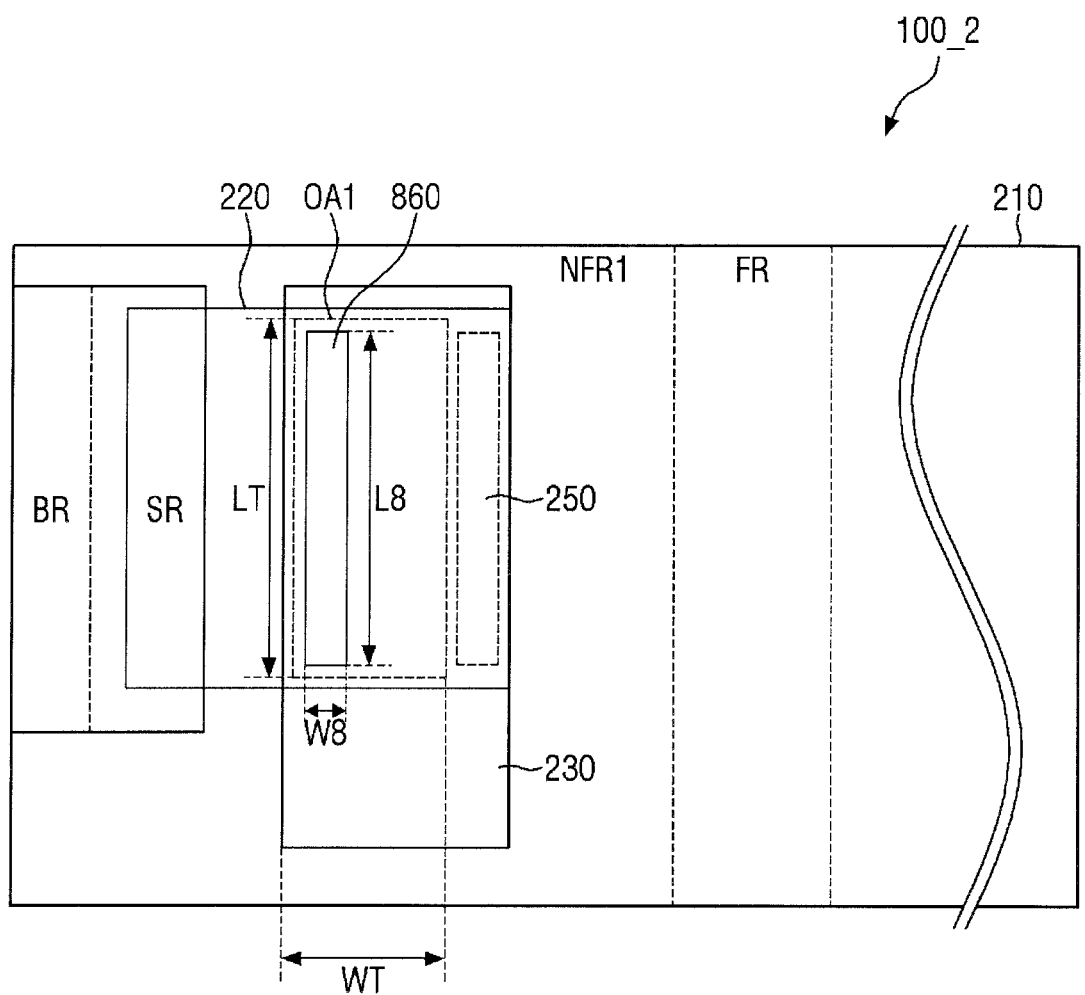

Referring to FIG. 8, a display device 100_2 (or a second coupling layer 260) is different from the display device 100 of FIG. 2 in that the display device 100_2 includes a third coupling member 860.

The third coupling member 860 has a rectangular planar shape, and may have an eighth length L8 in the vertical direction that is larger than an eighth width W8 in the horizontal direction. For example, the ratio of the eighth length L8 to the eighth width W8 may be about 3 or more. Meanwhile, the planar shape of the third coupling member 860 is not limited thereto. The third coupling member 860 may be located at the left edge (that is, at an edge opposite to the edge where a first coupling layer 250 is located) of the overlapping area OA1, or may be located adjacent to the right edge thereof.

The eighth length L8 of the third coupling member 860 may be longer or equal to the length of the first coupling layer 250 in the vertical direction. For example, the upper side of the third coupling member 860 may be located above the upper side of the first coupling layer 250, and the lower side of the third coupling member 860 may be located below the lower side of the first coupling layer 250. As another example, the upper side of the third coupling member 860 may coincide with the upper side of the first coupling layer 250, or may be located on the same line (or the same plane) as the upper side of the first coupling layer 250, and the lower side of the third coupling member 860 may be located below the lower side of the first coupling layer 250. As still another example, the upper side of the third coupling member 860 may coincide with the upper side of the first coupling layer 250, or may be located on the same line (or the same plane) as the upper side of the first coupling layer 250, and the lower side of the third coupling member 860 may coincide with the lower side of the first coupling layer 250.

The eighth width W8 of the third coupling member 860 is ½ times, or more, the overlap width WT of the overlapping area OA1. When the overlap length LT of the overlapping area OA1 is longer than the overlap width WT of the overlapping area OA1 (for example, when the ratio of the overlap length LT to the overlap with WT is about 3 or more), the workability of the coupling process between the circuit board 230 and the connection film 220 can be improved through the third coupling member 860.

Figure 9:
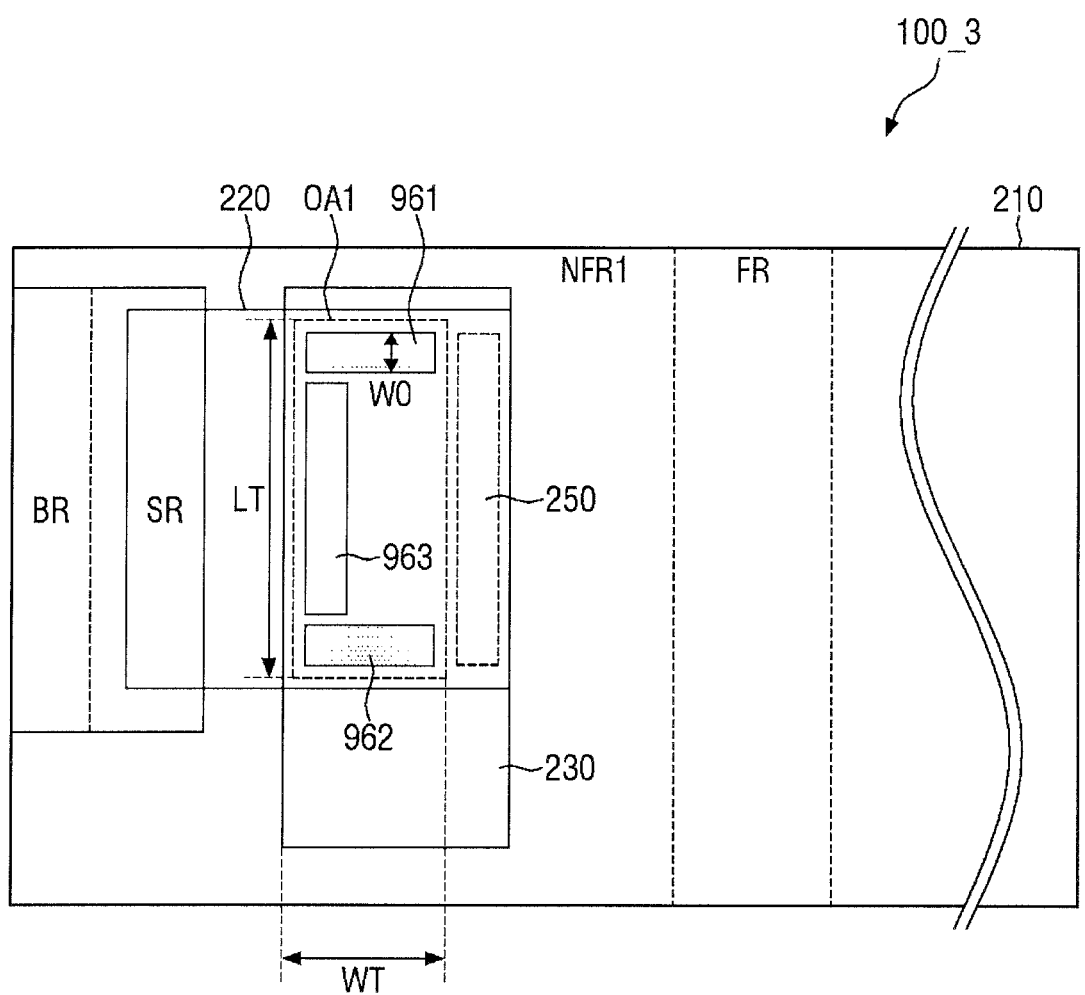

Referring to FIG. 9, a display device 100_3 (or a second coupling layer 260) is different from the display device 100 of FIG. 2 in that the display device 100_3 includes fourth, fifth, and sixth coupling members 961, 962, and 963.

The fourth coupling member 961 and the fifth coupling member 962 may be substantially the same as, or similar to, the first coupling member 761 and the second coupling member 762 shown in FIG. 7. The sixth coupling member 963 may be substantially the same as or similar to, the third coupling member 860 shown in FIG. 8. Therefore, a redundant description will not be repeated.

The fourth to sixth coupling members 961, 962, and 963 may have the same thickness on the same plane (e.g., between the connection film 220 and the circuit board 230), and might not overlap each other.

Hereinafter, it is assumed that the fourth to sixth coupling members 961, 962, and 963 are line tapes having a reference width W0.

For example, when the overlap width WT of the overlapping area OA1 is between about 1.5 times and about 3 times the size of the reference width W0, and when the overlap width WT is about half the size of (or less) the overlap length LT, each of the fourth and fifth coupling members 961 and 962 may have the same width (that is, horizontal width) as the overlap width WT of the overlapping area OA1. In this case, the sixth coupling member 963 is located between the fourth and fifth coupling members 961 and 962, and the length of the sixth coupling member 963 in the vertical direction may be smaller than a value obtained by subtracting the total length (total length in the vertical direction) of the fourth and fifth coupling members 961 and 962 from the overlap length LT of the overlapping area OA1.

As another example, when the overlap width WT of the overlapping area OA1 is about 3 times or more greater than the reference width W0, and when the overlap width WT is about 2 times or more greater than the overlap length LT, the sixth coupling member 963 may have the same length as the overlap length LT. In this case, the fourth and fifth coupling members 961 and 962 are instead located between the sixth coupling member 963 and the first coupling layer 250, and the length of each of the fourth and fifth coupling members 961 and 962 in the horizontal direction may be smaller than a value obtained by subtracting the width in the horizontal direction of the sixth coupling member 963 from the overlap width WT of the overlapping area OA1.

As still another example, when the overlap width WT of the overlapping area OA1 is between about 1.5 times and about 3 times the size of the reference width W0, and when the ratio of the overlap width WT and the overlap length LT is about 2 or less, the fourth coupling member 961 may have the same width as the overlap width WT, the sixth coupling member 963 may have a length that is equal to or smaller than a value obtained by subtracting the reference width W0 from the overlap length LT, and the fifth coupling member may have a width equal to or smaller than a value obtained by subtracting the reference width W0 from the overlap width WT.

Figure 10:
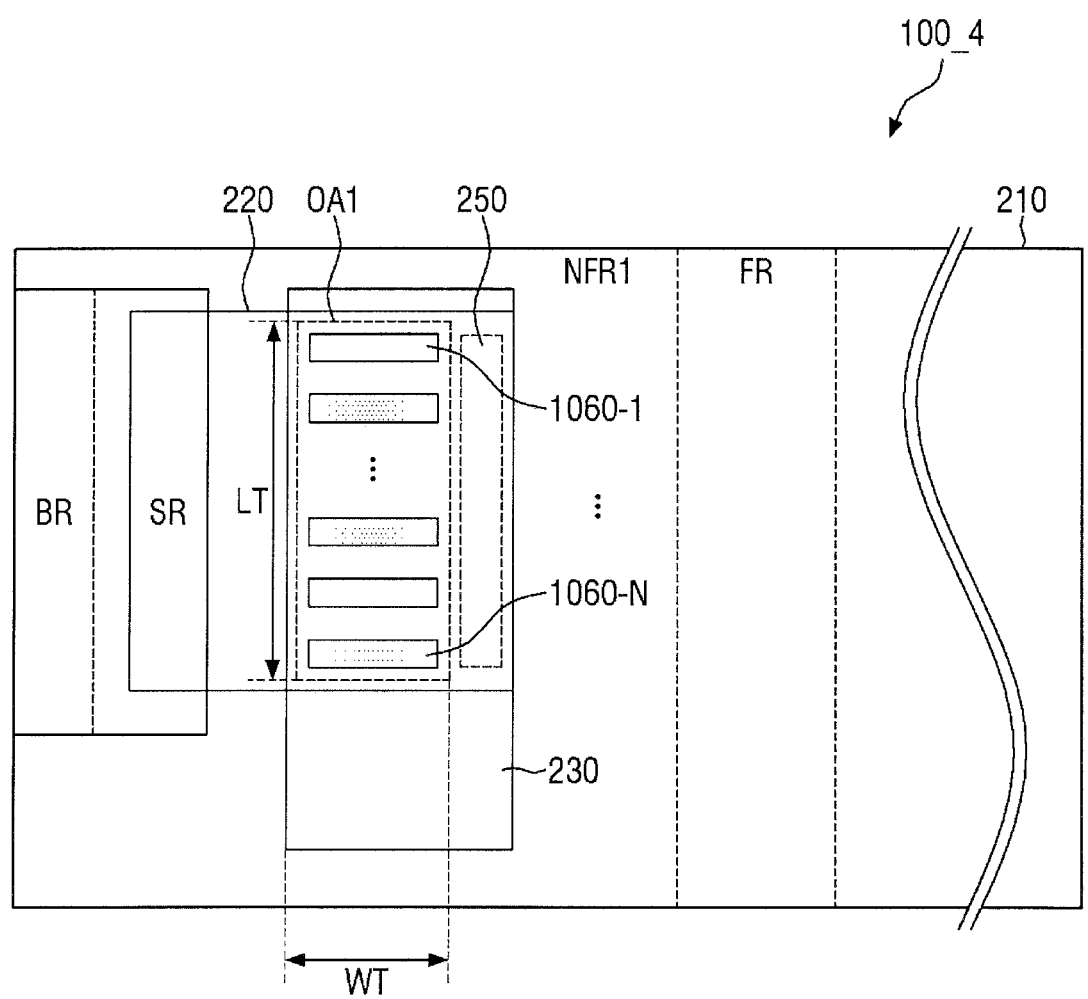

Referring to FIG. 10, a display device 100_4 (or a second coupling layer 260) is different from the display device 100_1 of FIG. 7 in that the display device 100_4 includes seventh coupling members 1060-1 to 1060-N (N being an integer of 3 or more).

Each of the seventh coupling members 1060-1 to 1060-N may be substantially the same as the first coupling member 760 having been described with reference to FIG. 7. Therefore, a redundant description will not be repeated.

The seventh coupling members 1060-1 to 1060-N may be arranged repeatedly to be spaced apart from each other at suitable intervals in the vertical direction. Here, the intervals between the seventh coupling members 1060-1 to 1060-N may be the same as, or different from, each other. For example, the intervals between the seventh coupling members 1060-1 to 1060-N may increase toward the upper side, and may decrease toward the lower side.

When each of the overlap width WT and overlap length LT of the overlapping area OA1 is about 2 time or more greater than the length of each of the seventh coupling members 1060-1 to 1060-N, and when the overlap width WT is about 1.5 times or more greater than the overlap length LT, the width between the connection film 220 and the circuit board 230 can be substantially uniformly maintained over the entire overlapping area OA1 through the seventh coupling members 1060-1 to 1060-N.

Figure 11:
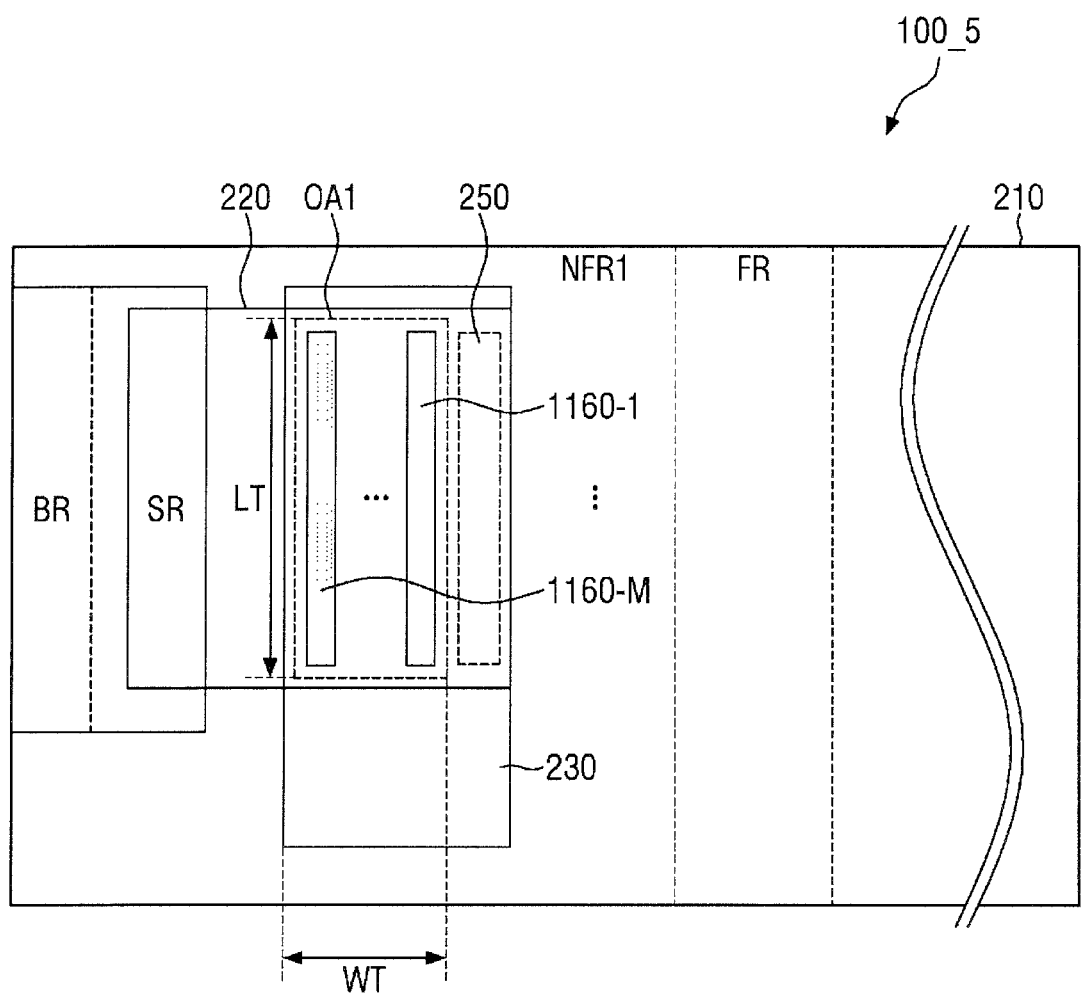

Referring to FIG. 11, a display device 100_5 (or a second coupling layer 260) may include eighth coupling members 1160-1 to 1160-M (M is an integer of 3 or more).

Each of the eighth coupling members 1160-1 to 1160-M may be substantially the same as the third coupling member 860 having been described with reference to FIG. 8. Therefore, a redundant description will not be repeated.

The eighth coupling members 1160-1 to 1160-M may be arranged repeatedly to be spaced apart from each other at suitable intervals in the horizontal direction. Here, the intervals between the eighth coupling members 1160-1 to 1160-M may be the same as, or different from, each other. For example, the intervals between the eighth coupling members 1160-1 to 1160-M may decrease toward the left side, and may increase toward the right side. As another example, the intervals between the eighth coupling members 1160-1 to 1160-M may increase toward the left side, and may decrease toward the right side.

When each of the overlap width WT and overlap length LT of the overlapping area OA1 is about 2 times or more greater than the width of each of the eighth coupling members 1160-1 to 1160-M, and when the overlap length LT is about 1.5 times or more greater than the overlap width WT, the width between the connection film 220 and the circuit board 230 can be substantially uniformly maintained over the entire overlapping area OA1 through the eighth coupling members 1160-1 to 1160-M.

Figure 12:
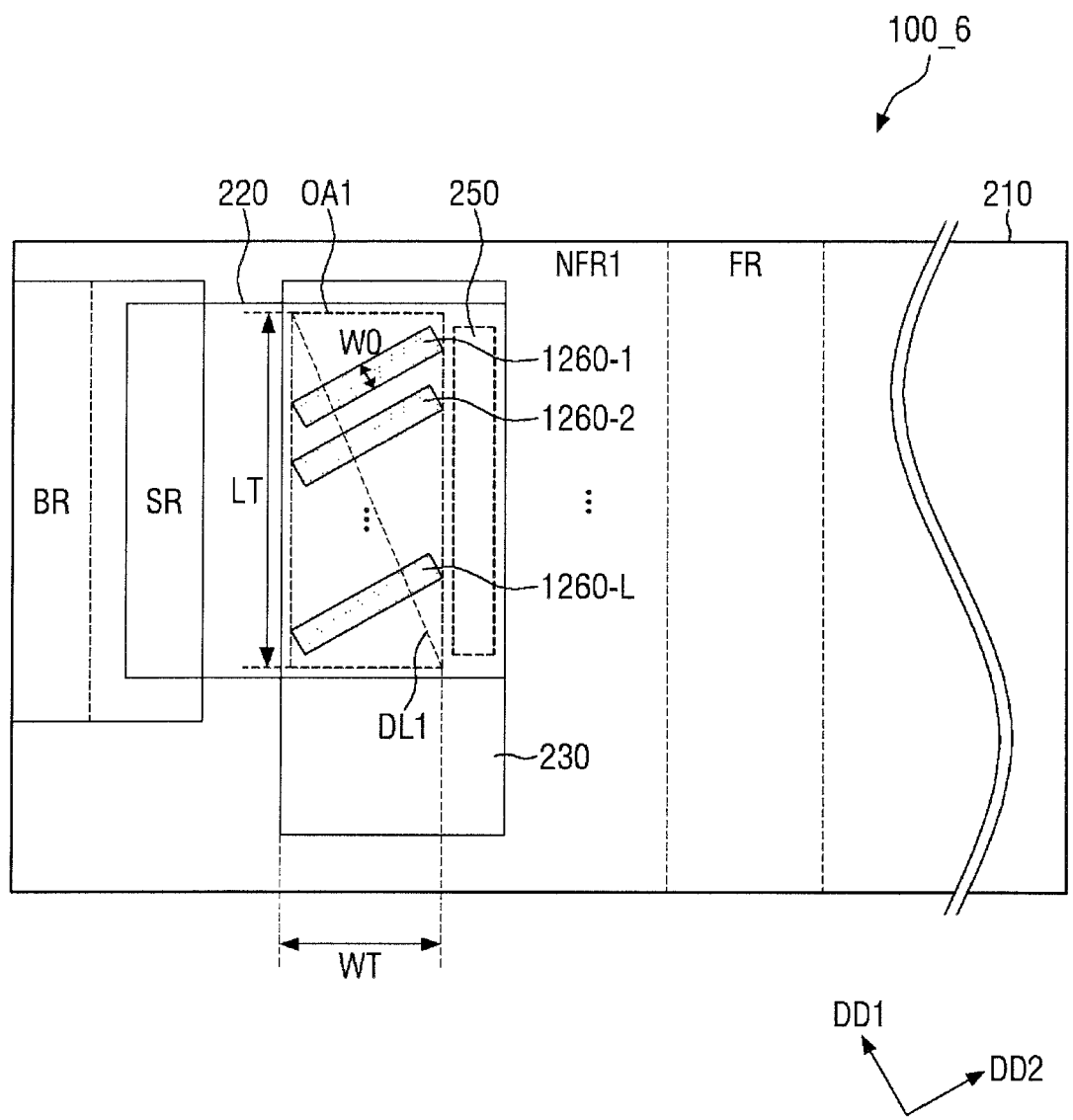

Referring to FIG. 12, a display device 100_6 (or a second coupling layer 260) is different from the display device 100 of FIG. 2 in that the display device 100_6 includes ninth coupling members 1260-1 to 1260-L (L is a positive integer).

The ninth coupling members 1260-1 to 1260-L each may have a rectangular shape, may have a reference width W0, may extend in a second diagonal direction DD2, and may be arranged repeatedly to be spaced apart from each other at suitable intervals in a first diagonal direction DD1 that is substantially perpendicular to the second diagonal direction DD2. Here, the first diagonal direction DD1 may be a direction in which a first reference line DL1 (or a diagonal line) connecting the two most distant points (or corner points) of the overlapping area OA extends. One end (starting point or end point) of the first reference line DL1 may be adjacent to the extended portion of the circuit board 230 and the first coupling layer 250.

The intervals between the ninth coupling members 1260-1 to 1260-L may be the same as, or different from, each other. For example, the intervals between the ninth coupling members 1260-1 to 1260-L may decrease toward the lower side, and may increase toward the upper side.

As shown in FIG. 12, the circuit board 230 may overlap the connection film 220, and may extend in a downward direction with a larger area than the connection film 220. In this case, a bending force may be generated along the first reference line DL1 due to the extended portion of the circuit board 230. Therefore, considering the distribution of the bending force, the damages of the circuit board 230, the first coupling layer 250, and the like can be reduced or prevented by the ninth coupling members 1260-1 to 1260-L.

Figure 13:
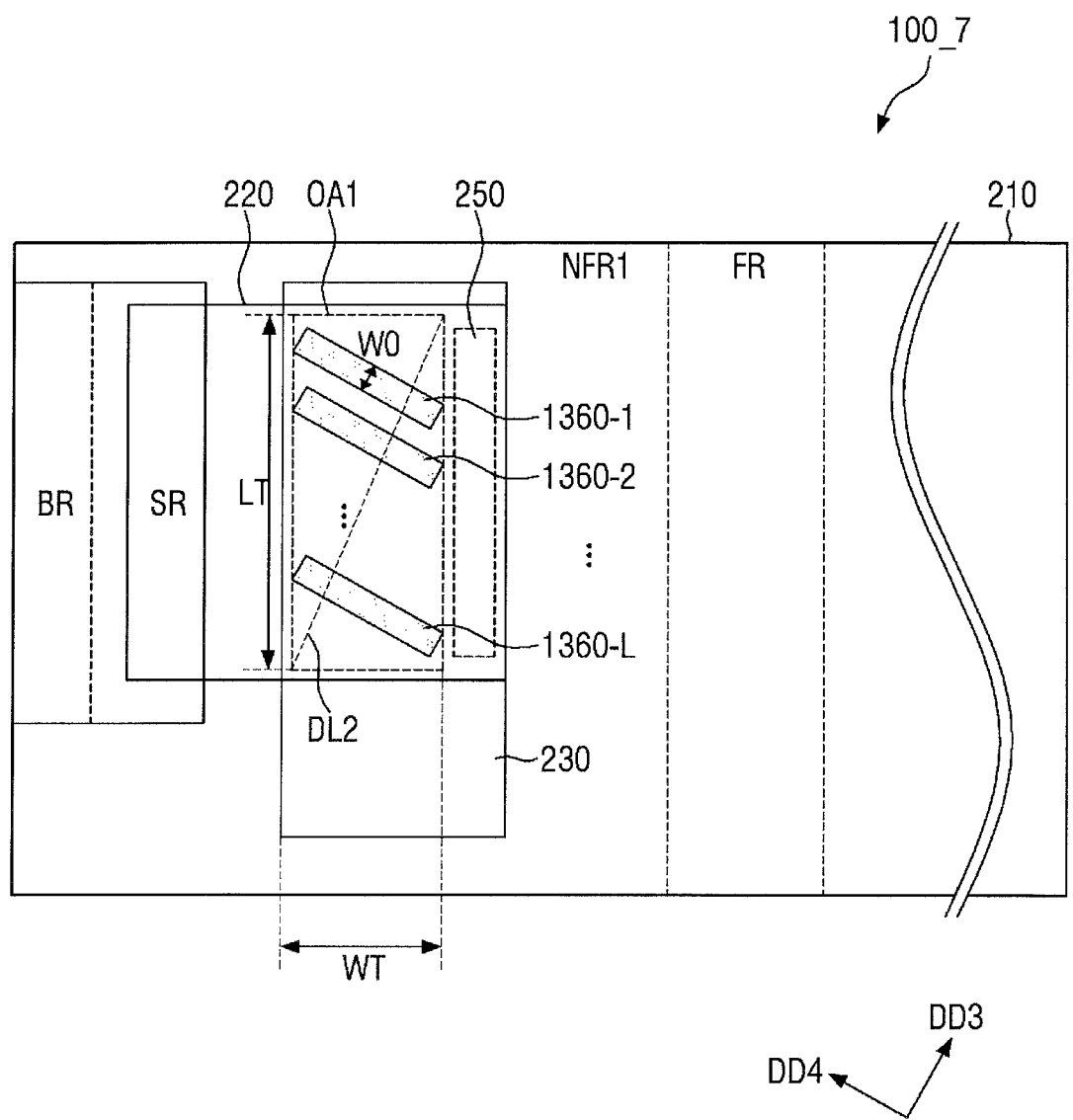

Referring to FIG. 13, a display device 100_7 (or a second coupling layer 260) is different from the display device 100_6 of FIG. 12 in that the display device 100_7 includes tenth coupling members 1360-1 to 1360-L (L is a positive integer).

The tenth coupling members 1360-1 to 1360-L may be substantially the same as the ninth coupling members 1260-1 to 1260-L. Therefore, a redundant description will not be repeated.

The tenth coupling members 1360-1 to 1360-L may extend in a fourth diagonal direction DD4, and may be arranged repeatedly to be spaced apart from each other at suitable intervals in a third diagonal direction DD3 that is substantially perpendicular to the fourth diagonal direction DD4. Here, the third diagonal direction DD3 may be a direction in which a second reference line DL2 connecting the two most distant points (or corner points) of the overlapping area OA extends. One end (starting point or end point) of the second reference line DL2 may be adjacent to the extended portion of the circuit board 230, and may be spaced apart from the first coupling layer 250.

At least one of the tenth coupling members 1360-1 to 1360-L is continuously supported with respect to a line from which a bending force is generated due to the extended portion of the circuit board 230, so that the damages of the circuit board 230, the first coupling layer 250, and the like due to the extended portion of the circuit board 230 can be reduced or prevented.

Figure 14:
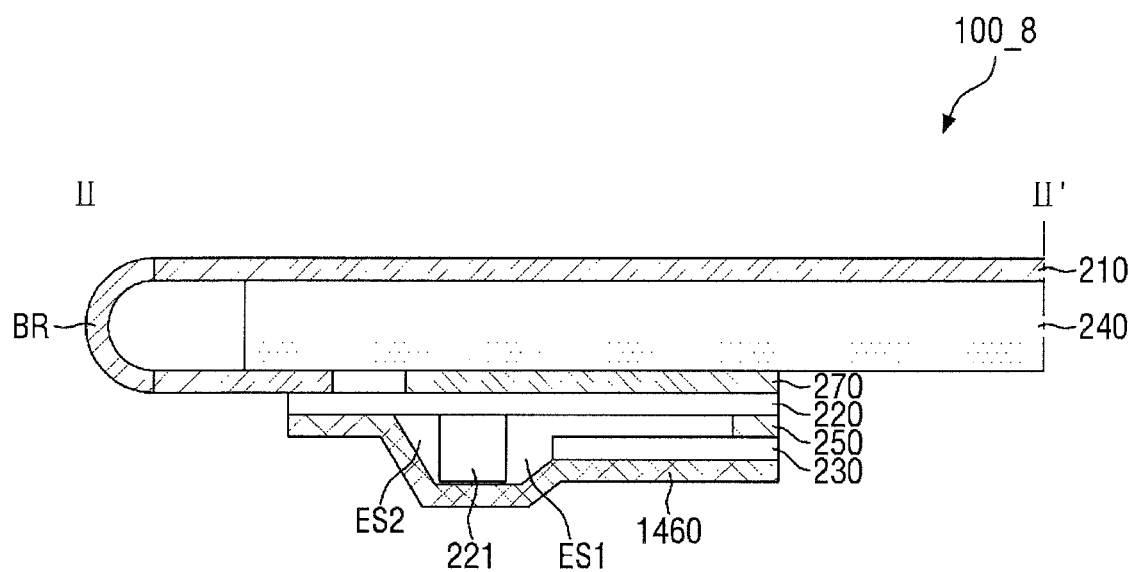
FIG. 14 is a cross-sectional view of a display device according to another embodiment.
Figure 15:
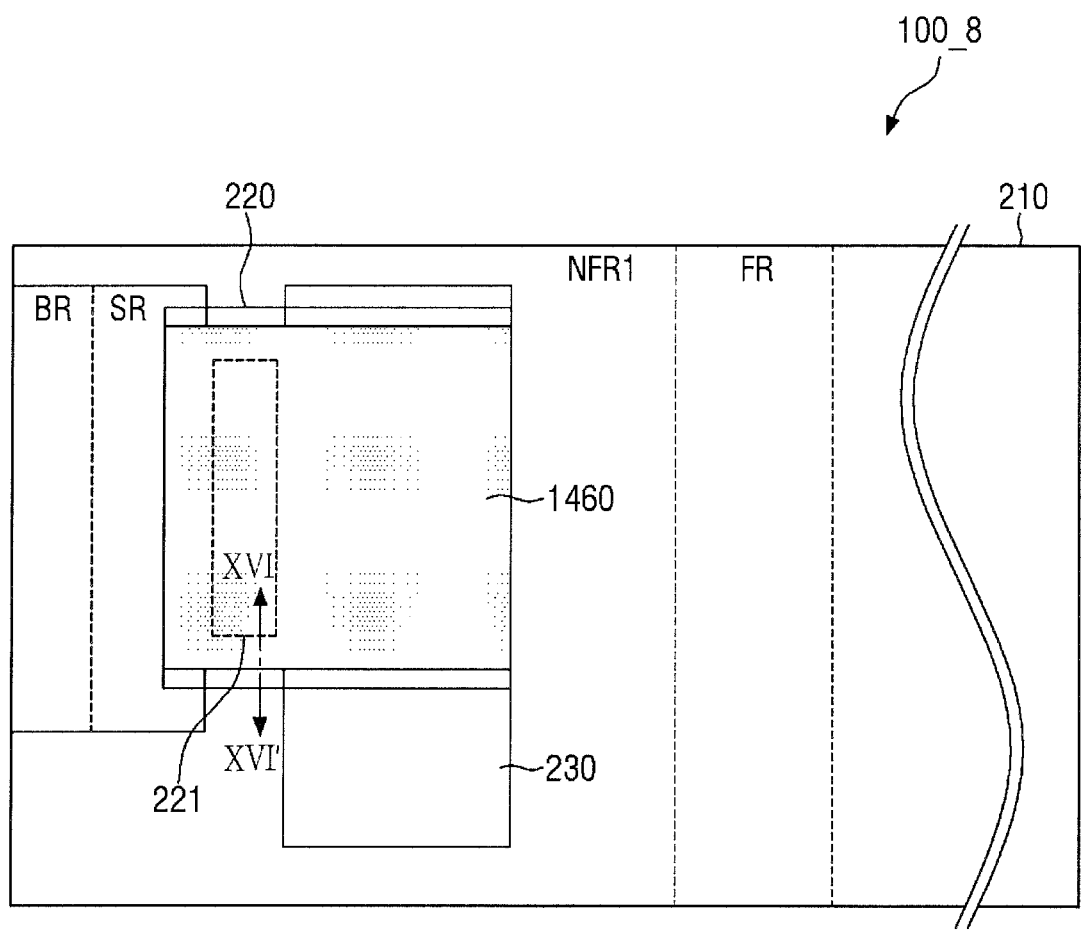
FIG. 15 is a plan view of the display device of FIG. 14.
Figure 16:
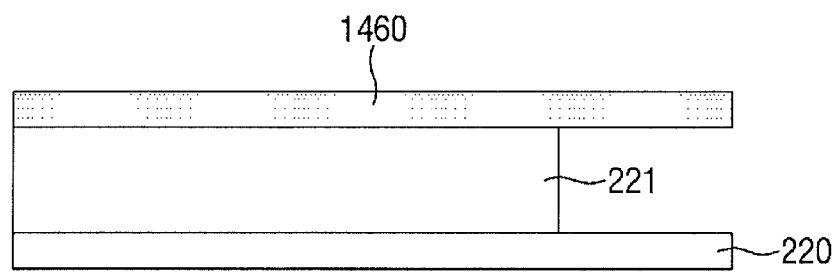
FIG. 16 is a cross-sectional view taken along the line XVI-XVI' in FIG. 15.

FIG. 14 is a cross-sectional view of a display device according to another embodiment. FIG. 15 is a plan view of the display device of FIG. 14. FIG. 16 is a cross-sectional view taken along the line XVI-XVI' in FIG. 15.

Referring to FIGS. 1, 2, and 14, a display device 100_8 of FIG. 14 is different from the display device 100 of FIG. 2 in that the display device 100_8 includes a coupling film 1460 (or a cover member).

The coupling film 1460 may be located to overlap the connection film 220 and the circuit board 230 in the thickness direction, and may be attached to the lower surfaces of the connection film 220 and the circuit board 230 (or to the lower surface of portions of the connection film 220 and the circuit board 230). The coupling film 1460 may be implemented as a single-sided adhesive film, and may be attached to the exposed portion of the lower surface of the connection film 220 and the lower surface of the circuit board 230. That is, the coupling film 1460 may completely cover the connection film 220 and the circuit board 230 at the bottom, and may fix the circuit board 230 to the connection film 220.

As described with reference to FIG. 2, when the connection film 220 includes the driving chip 221 mounted in an area not overlapping the circuit board 230, the coupling film 1460 may cover the driving chip 221. Empty spaces ES1 and ES2 formed along the side surface of the driving chip 221 and connected to the outside may be formed between the connection film 220 and the coupling film 1460. The empty spaces ES1 and ES2 may be formed by steps due to the driving chip 221 (for example, steps corresponding to the height from the lower surface of the connection film 220 to the lower end surface of the driving chip 221, and corresponding to the height from the lower surface of the circuit board 230 to the lower end surface of the driving chip 221) and the bending properties of the coupling film 1460.

As shown in FIG. 16, when the coupling film 1460 is formed larger than the driving chip 221 in the vertical direction (that is, in the vertical direction of the display device 100_8), the lower end of the coupling film 1460 may be kept spaced apart from the connection film 220. Air can circulate along the empty spaces ES1 and ES2 connected to the outside, and the heat generated from the driving chip 221 can be prevented from being trapped between the connection film 220 and the coupling film 1460.

Meanwhile, although it is shown in FIGS. 15 and 16 that the coupling film 1460 has a length that is longer than the length of the driving chip 221 in the vertical direction, the present invention is not limited thereto. For example, the length of the coupling film 1460 is equal to, or shorter than, that of the driving chip 221, so that the coupling film 1460 may partially cover the driving chip 221.

As described above, the coupling film 1460 may be located under the connection film 220 and the circuit board 230, may entirely cover the connection film 220 and the circuit board 230, and may fix the circuit board 230 to the connection film 220. Further, because the empty spaces ES1 and ES2 are exposed to the outside are formed in the vicinity of the driving chip 221 mounted on the connection film 220, the heat generated from the driving chip 221 can be prevented from being trapped between the connection film 220 and the coupling film 1460. Further, because the coupling film 1460 is located after the connection (or attachment) between the connection film 220 and the circuit board 230 is performed, a process of locating the coupling film 1460 may be performed separately from the coupling process of the connection film 220 and the circuit board 230.

Figure 17:
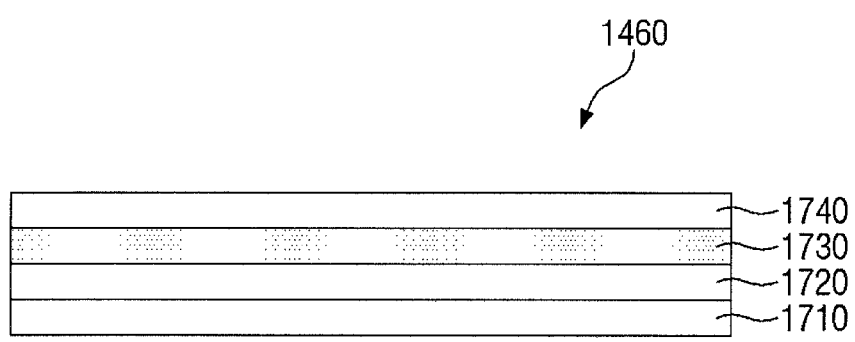
FIG. 17 is a cross-sectional view of a coupling film according to an embodiment.

FIG. 17 is a cross-sectional view of a coupling film according to an embodiment.

Referring to FIG. 17, the coupling film 1460 may include a first insulating layer 1710, a conductive layer 1720, and a second insulating layer 1730, which are sequentially laminated.

The first insulating layer 1710 may cover the upper surface of the driving chip 221, and may be in direct contact with the connection film 220 and the circuit board 230.

When the conductive layer 1720 is brought into contact with the driving chip 221, signals generated from the driving chip 221 may be confused. Accordingly, the driving chip 221 and the conductive layer 1720 may be completely insulated from each other by the first insulating layer 1710.

The first insulating layer 1710 may include an organic insulating material. Example of the organic insulating material may include polyethersulphone (PES), polyacrylate (PA), polyarylate (PAR), polyetherimide (PEI), polyethylenenaphthalate (PEN), polyethyleneterephthalate (PET), polyphenylenesulfide (PPS), polyallylate, polyimide (PI), polycarbonate (PC), cellulosetriacetate (CAT), cellulose acetate propionate Cellulose acetate propionate (CAP), and combinations thereof.

The conductive layer 1720 may be located on the first insulating layer 1710. The conductive layer 1720 may include a metal or a polymer material having electrical conductivity. For example, the metal may include at least one selected from aluminum (Al)-based metals including aluminum alloys, silver (Ag)-based metals including silver alloys, copper (Cu)-based metals including copper alloys, molybdenum (Mo)-based metals including molybdenum alloys, chromium (Cr), titanium (Ti), and tantalum (Ta). However, these metals are illustrative, and the kinds of metals that may be used are not limited thereto. Any metal having electrical conductivity may also be used as the material of the conductive layer 1720. The conductive layer 1720 may be bonded to the first insulating layer 1710 through a nonconductive adhesive.

The second insulating layer 1730 may be located on the conductive layer 1720. The second insulating layer 1730 may completely cover the conductive layer 1720. Thus, the first insulating layer 1710 and the second insulating layer 1730 may be located to respectively cover the back surface (or lower surface) and front surface (or upper surface) of the conductive layer 1720. That is, the front surface and back surface of the conductive layer 1720 may not be exposed to the outside by the first insulating layer 1710 and the second insulating layer 1730. The second insulating layer 1730 may be bonded to the conductive layer 1720 through a nonconductive adhesive.

The conductive layer 1720 may serve to induce static electricity generated irregularly in accordance with the transmission of various signals in the connection film 220 and the circuit board 230. The reason for this is that the static electricity may be generated unintentionally in accordance with the signal transmission in the drive chip 221 or various wirings arranged in the connection film 220, and the static electricity may affect the driving chip 221 or the adjacent wiring to confuse the signals.

Meanwhile, at least one ground electrode may be formed under the circuit board 230. The ground electrode may be located in an island shape in a suitable area of the circuit board 230. In this case, the conductive layer 1720 of the coupling film 1460 may be electrically connected to the ground electrode. That is, the conductive layer 1720 of the coupling film 1460 may be grounded to the ground electrode.

The coupling film 1460 may further include a heat radiation layer 1740. The heat radiation layer 1740 may be formed of a graphite film, and may be located on or applied on the second insulating layer 1730.

As described above, when the coupling film 1460 includes the conductive layer 1720, the static electricity may be induced to move to the ground electrode of the circuit board 230 through the conductive layer 1720. Therefore, it is possible to prevent the static electricity from adversely affecting the flow of signals or the electrical characteristics of each wiring.

Figure 18:
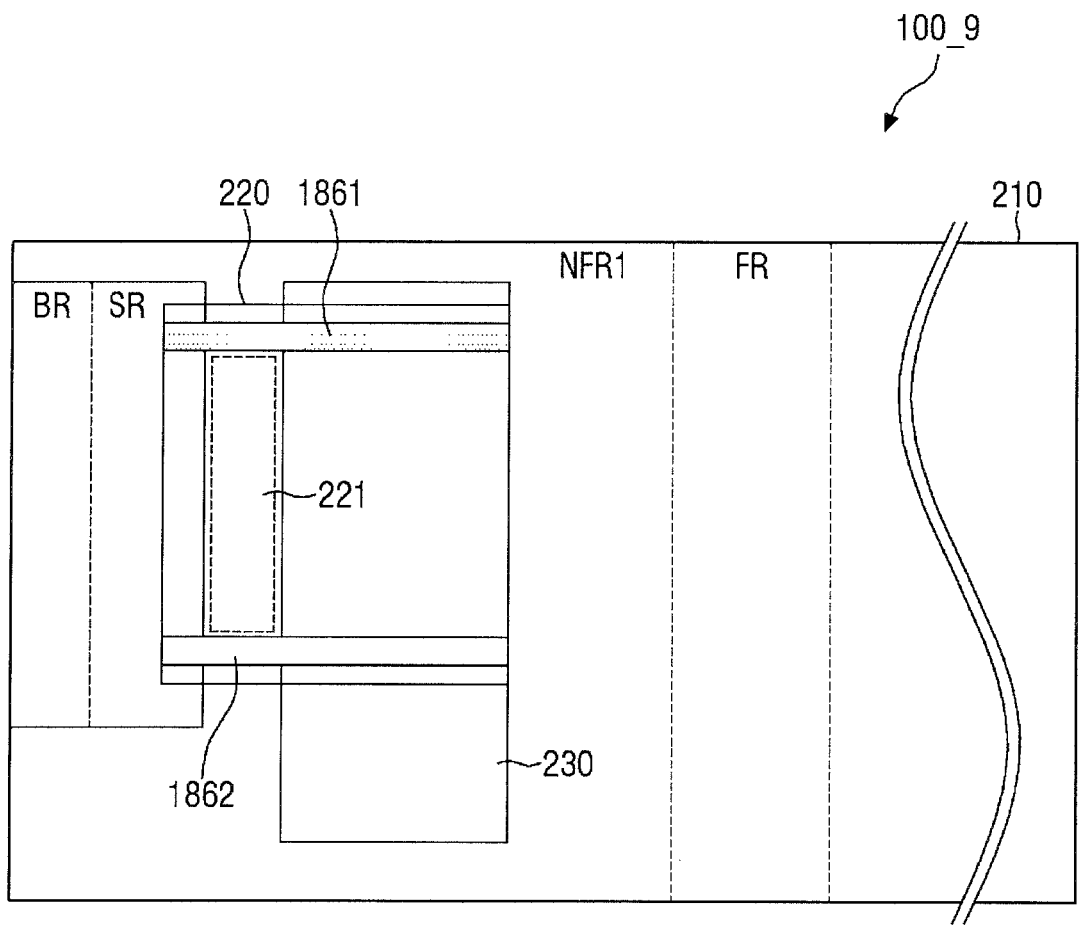
FIG. 18 is a plan view of a display device according to still another embodiment.

FIG. 18 is a plan view of a display device according to still another embodiment.

Referring to FIG. 18, a display device 100_9 of FIG. 18 is different from the display device 100_8 of FIG. 15 in that the display device 100_9 includes first and second cover members 1861 and 1862 not covering the driving chip 221.

Each of the first and second cover members 1861 and 1862 is implemented as a single-sided adhesive tape extending in the horizontal direction. The first cover member/adhesive tape 1861 may be located on the upper portion of the overlapping area of the circuit board 230 (that is, the area overlapping the connection film) and the upper portion of the exposed area of the connection film 220. Similarly, the second cover member/adhesive tape 1862 may be located on the lower portion of the overlapping area of the circuit board 230 and the lower portion of the exposed area of the connection film 220.

Although it is shown in FIG. 18 that the width of the first cover member/adhesive tape 1861 (that is, the width in the vertical direction) and the width of the second cover member/adhesive tape 1862 are equal to each other, this is illustrative, and the present invention is not limited thereto. For example, the width of the second cover member/adhesive tape 1862 may be greater than the width of the first cover member/adhesive tape 1861.

Figure 19:
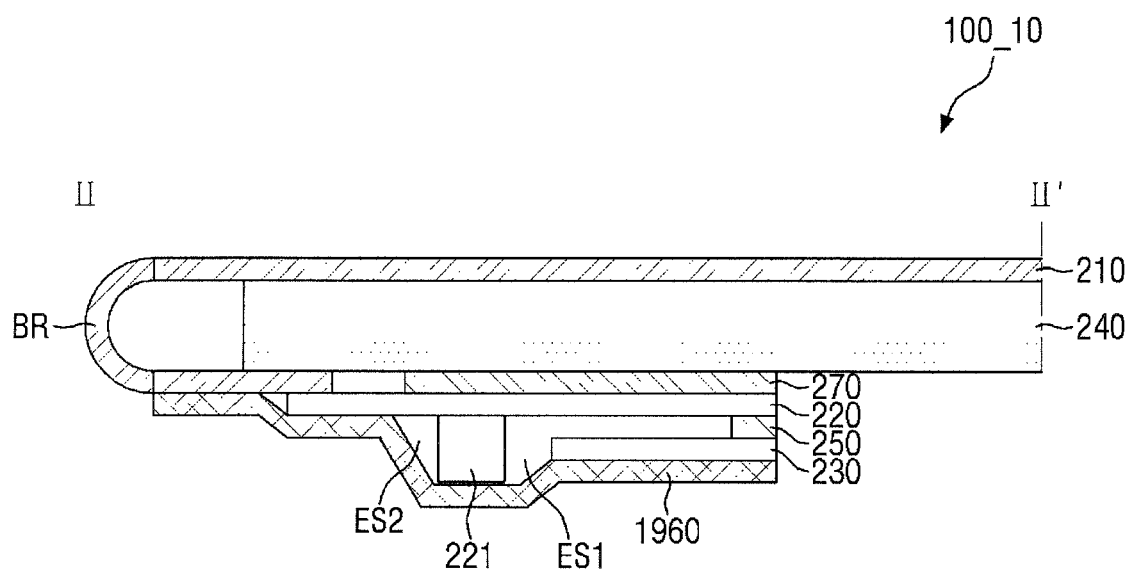
FIG. 19 is a cross-sectional view of a display device according to still another embodiment.
Figure 20:
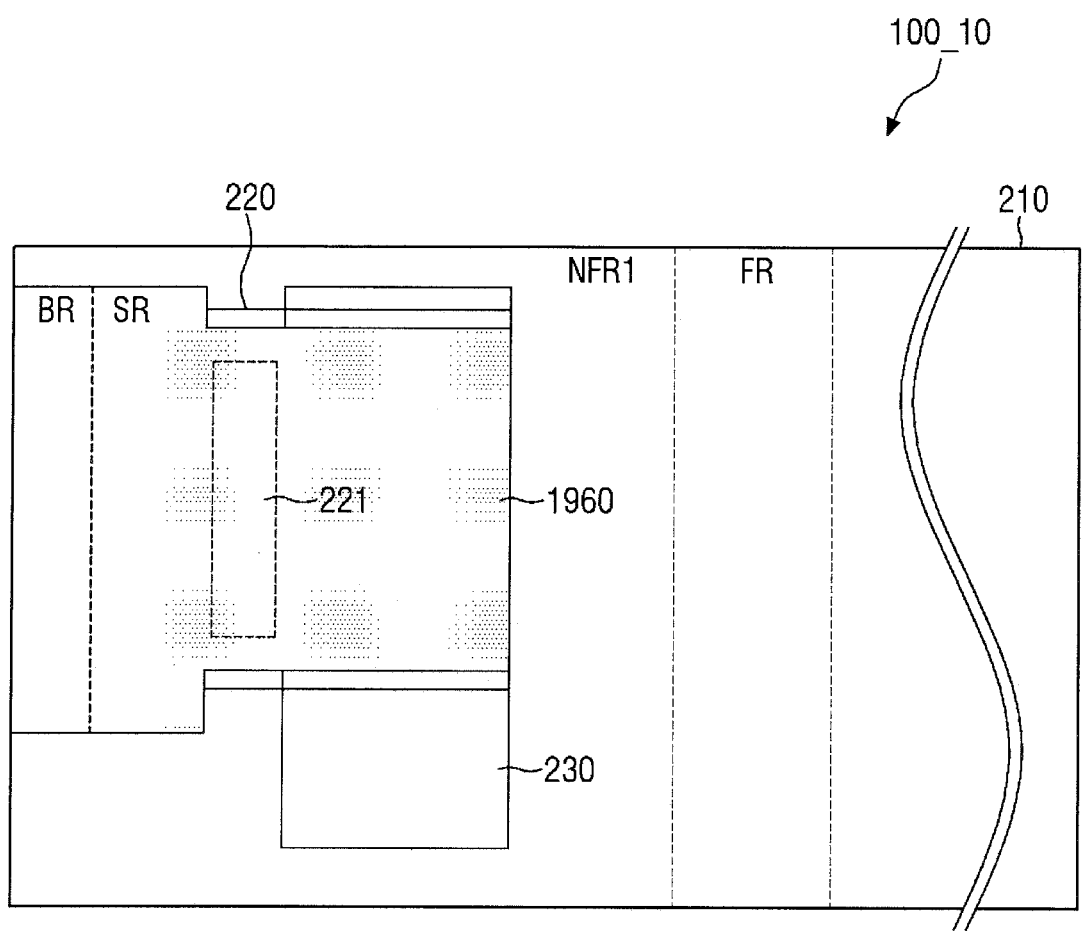
FIG. 20 is a plan view of a display device according to still another embodiment.

FIG. 19 is a cross-sectional view of a display device according to still another embodiment. FIG. 20 is a plan view of a display device according to still another embodiment.

Referring to FIGS. 19 and 20, a display device 100_10 according to this embodiment is different from the display device 100_8 of FIG. 14 in that the display device 100_10 includes a coupling film 1960 covering a part of the display panel 210.

The coupling film 1960 is a single-sided adhesive film, and may be located to cover the lower surface of the circuit board 230, the region where the connection film 220 is exposed downward (or a region not overlapping the circuit board 230), and the sub region SR of the display panel 210 (or a portion of the sub region SR excluding the first contact portion SPT1).

Similarly to the coupling film 1460 having been described with reference to FIG. 17, the coupling film 1960 may include a conductive layer, and may induce static electricity generated from the display panel 210.

As shown in FIG. 20, the coupling film 1960 may be located to cover the entire sub region SR of the display panel 210.

Figure 21:
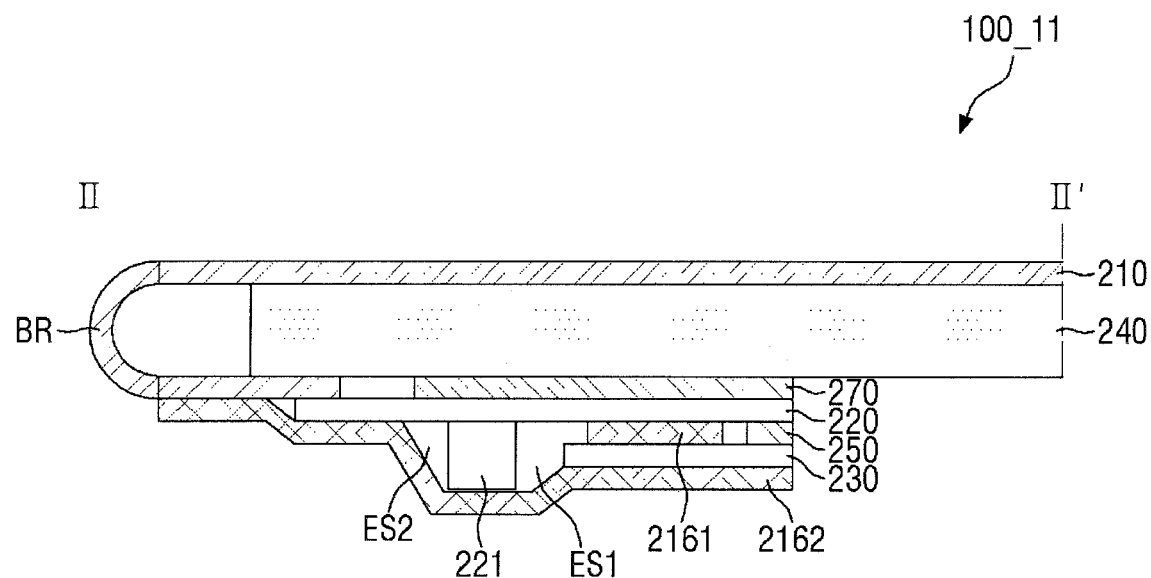
FIG. 21 is a cross-sectional view of a display device according to still another embodiment.

FIG. 21 is a cross-sectional view of a display device according to still another embodiment.

Referring to FIG. 21, a display device 100_11 according to this embodiment is different from the display device 100 of FIG. 2 and the display device 100_8 of FIG. 14 in that the display device 100_11 includes both a second coupling layer 2161 and a coupling film 2162.

The second coupling layer 2161 is located between the connection film 220 and the circuit board 230. The second coupling layer 2161 may be implemented as the first to tenth coupling members having been described with reference to FIGS. 7 to 13, or may include a combination thereof.

The coupling film 2162 is located to cover the exposed portion of the connection film 220 and the lower surface of the circuit board 230, and may be implemented as the coupling films having been described with reference to FIGS. 14 to 20.

Figure 22:
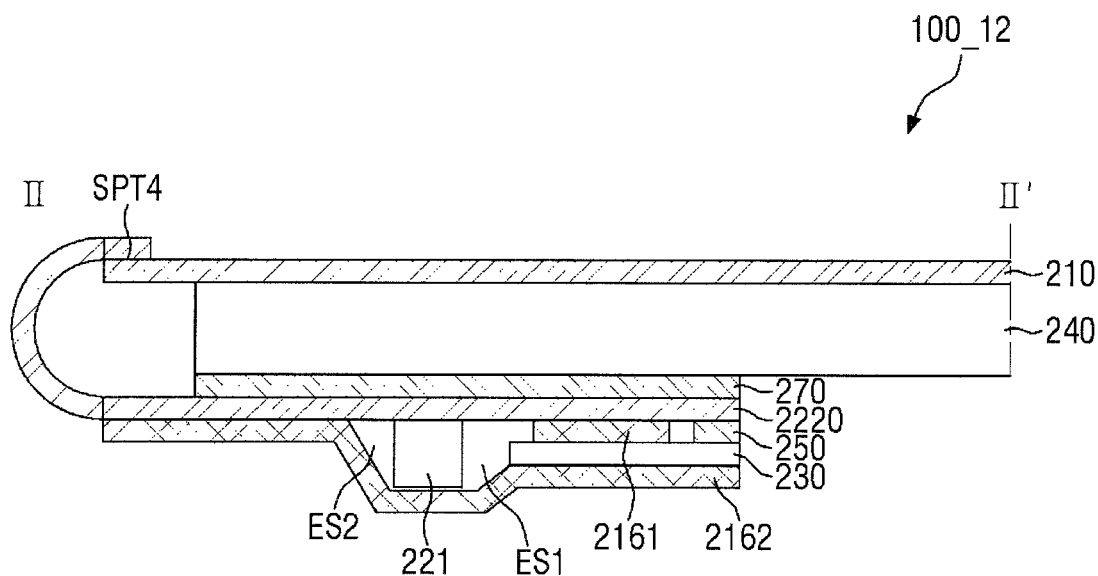
FIG. 22 is a cross-sectional view of a display device according to still another embodiment.

FIG. 22 is a cross-sectional view of a display device according to still another embodiment.

Referring to FIG. 22, a display device 100_12 according to this embodiment is different from the display device 100 of FIG. 2 in that the display device 100_12 includes a display panel 210 including only a main region MR and a connection film 2220 having a region bent in a thickness direction.

The display panel 210 may include only the main region MR of the display panel 210 having been described with reference to FIG. 4, and a fourth contact portion SPT4 may be formed at one side of the upper surface of the display panel 210 at the main region MR. The position of the fourth contact portion SPT4 shown in FIG. 4 is illustrative, and is not limited thereto. For example, the fourth contact portion SPT4 may be located on the left lower side of the display panel 210.

The connection film 2220 may be located in the thickness direction to overlap the display panel 2210, and may be coupled to the cover panel 240 through the adhesive layer 270. One side of the connection film 2220 is bent upward, and one side of the bent connection film 2220 may be connected to the fourth contact portion SPT4 of the display panel 210.

That is, the display device 100_12 has a structure in which the connection film 2220 is bent and connected to the display panel 210. Even in this case, the circuit board 230 is fixed to the connection film 2220 using the second coupling layer 2261 and the coupling film 2162, thereby reducing or preventing the occurrence of damage in the vicinity of the first coupling layer 250.

As described above, according to the embodiments of the present invention,

Further, according to the display device of an embodiment of the present invention, the circuit board is located to overlap the connection film, and thus the circuit board is located on one side of the display panel, thereby increasing the utilization of internal space. Further, the circuit film is fixed to the connection film through a coupling layer located between the connection film and the circuit board or a coupling film covering the connection film and the circuit board, thereby reducing or preventing the damage at the contact portion between the connection film and the circuit board and improving the reliability of a product.

The effects of embodiments of the present invention are not limited by the foregoing, and other various effects are considered herein.

Although the preferred embodiments of the present invention have been disclosed for illustrative purposes, those skilled in the art will appreciate that various modifications, additions and substitutions are possible, without departing from the scope and spirit of the invention as disclosed in the accompanying claims, with functional equivalents thereof to be included.

What is claimed is:

1. A display device, comprising:
   a display panel;
   a connection film connected to one side of the display panel;
   a circuit board connected to the connection film; and
   a coupling portion coupling the connection film and the circuit board, located at an area where the connection film and the circuit board overlap each other, and comprising:
      a conductive first coupling portion for coupling the connection film and the circuit board; and
      an insulative second coupling portion for coupling the connection film and the circuit board,
   wherein the second coupling portion is a pressure-sensitive adhesive film.

2. The display device of claim 1, wherein the connection film comprises a first wiring connected to the first coupling portion,
   wherein the circuit board comprises a second wiring connected to the first coupling portion, and
   wherein the second coupling portion overlaps the first wiring and the second wiring.

3. The display device of claim 2, wherein the first coupling portion is adjacent to one side of the connection film, and to one side of the circuit board, in a first direction, and
   wherein the second coupling portion is adjacent to the other side of the circuit board.

4. The display device of claim 3, further comprising an integrated circuit adjacent the connection film and connected to the first wiring, wherein the circuit board does not overlap the integrated circuit.

5. The display device of claim 3, wherein the circuit board comprises a circuit area not overlapping the connection film and extending in a second direction crossing the first direction,
   wherein a length of the second coupling portion in the second direction is longer than a length of the first coupling portion in the second direction, and
   wherein the second coupling portion extends further in the second direction in a plan view than the first coupling portion.

6. The display device of claim 3, wherein the circuit board comprises a circuit area extending in a second direction crossing the first direction,
- wherein the second coupling portion comprises a plurality of first coupling patterns extending in the first direction with a first width, and repeatedly arranged along the second direction, and
- wherein a distance between adjacent ones of the first coupling patterns decreases toward the circuit area of the circuit board.

7. The display device of claim 3, wherein the second coupling portion comprises a plurality of second coupling patterns extending in a second direction crossing the first direction with a first width, and repeatedly arranged along the first direction, and
- wherein a distance between adjacent ones of the second coupling patterns decreases toward the first coupling portion.

8. The display device of claim 1, wherein the second coupling portion comprises a plurality of coupling patterns extending in a third direction with a first width, and repeatedly arranged along a fourth direction crossing the third direction, and
- wherein the third direction is a direction in which a reference line connecting two points that are spaced farthest from each other in an overlapping area where the connection film and the circuit board overlap each other is extended.

9. The display device of claim 8, wherein the circuit board comprises a circuit area extending in a second direction crossing a first direction, and
- wherein one end of the reference line is adjacent to the circuit area and the first coupling portion.

10. The display device of claim 1, wherein the second coupling portion has a thickness that is equal to a thickness of the first coupling portion,
- wherein a distance between the connection film and the circuit board is uniform throughout an overlapping area, and
- wherein the overlapping area is an area where the connection film and the circuit board overlap each other.

11. The display device of claim 1, wherein the display panel comprises a first area and a second area,
- wherein a degree of bending of the first area due to an external force is lower than a degree of bending of the second area due to the external force, and
- wherein the connection film and the circuit board overlap the first area in a thickness direction, and do not overlap the second area.

12. The display device of claim 11, wherein the one side of the display panel is bent in the thickness direction of the display panel,
- wherein the connection film is connected to a first surface of the display panel through a first contact portion formed on a first surface of the connection film, and
- wherein the first coupling portion is directly connected to a second contact portion formed on a second surface of the connection film and a third contact portion formed on a first surface of the circuit board.

13. The display device of claim 1, wherein the one side of the connection film is bent in a thickness direction of the display panel,
- wherein the connection film is connected to a first surface of the display panel through a first contact portion formed on a first surface of the connection film, and
- wherein the first coupling portion is directly connected to a second contact portion formed on a second surface of the connection film and a third contact portion formed on a first surface of the circuit board.

14. A display device, comprising:
- a display panel;
- a connection film connected to one side of the display panel;
- a circuit board connected to the connection film, the circuit board overlapping the connection film;
- a conductive first coupling portion between the connection film and the circuit board for coupling the connection film and the circuit board;
- an insulative coupling film coupling the connection film and the circuit board; and
- an integrated circuit adjacent the coupling film and connected to a first wiring in the connection film,
- wherein the circuit board is located between the connection film and the coupling film, and
- wherein the coupling film overlaps the integrated circuit.

15. The display device of claim 14,
- wherein the coupling film comprises a first insulating layer directly contacting the integrated circuit, a first conductive layer overlapping the first insulating layer in a thickness direction, and a second conductive layer overlapping the first conductive layer in the thickness direction, and
- wherein the first conductive layer is connected to a ground electrode formed on the circuit board.

16. The display device of claim 15, wherein a space formed along a side surface of the integrated circuit and communicating with the outside is located between the coupling film and the connection film.

17. The display device of claim 15, wherein the coupling film further comprises a heat radiation layer overlapping the second conductive layer, and completely overlapping the integrated circuit in the thickness direction.

18. The display device of claim 14, further comprising an insulative second coupling portion in an area where the connection film and the circuit board overlap each other for coupling the connection film and the circuit board.

19. A display device, comprising:
- a display panel;
- a connection film connected to one side of the display panel;
- a circuit board connected to the connection film, the circuit board overlapping the connection film;
- a conductive first coupling portion between the connection film and the circuit board for coupling the connection film and the circuit board; and
- an insulative coupling film coupling the connection film and the circuit board,
- wherein the circuit board is located between the connection film and the coupling film,
- wherein the one side of the display panel is bent in a thickness direction of the display panel,
- wherein the connection film is connected to a first surface of the display panel through a first contact portion formed on a first surface of the connection film,
- wherein the first coupling portion is directly connected to a second contact portion formed on a second surface of the connection film, and to a third contact portion formed on a first surface of the circuit board, and
- wherein the connection film completely overlaps the coupling film in the thickness direction.

20. The display device of claim 19, wherein the connection film partially overlaps the one side of the display panel and is attached to the one side of the display panel.

* * * * *